(12) United States Patent
Yokota

(10) Patent No.: US 10,854,680 B2
(45) Date of Patent: Dec. 1, 2020

(54) ORGANIC ELECTROLUMINESCENT ELEMENT, ORGANIC ELECTROLUMINESCENT PANEL, ORGANIC ELECTROLUMINESCENT UNIT, AND ELECTRONIC APPARATUS

(71) Applicant: JOLED INC., Tokyo (JP)

(72) Inventor: Kazuhiro Yokota, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/027,181

(22) Filed: Jul. 3, 2018

(65) Prior Publication Data
US 2019/0013364 A1    Jan. 10, 2019

(30) Foreign Application Priority Data

Jul. 4, 2017 (JP) .................................. 2017-131260
Jul. 10, 2017 (JP) .................................. 2017-134603

(51) Int. Cl.
*H01L 27/32* (2006.01)
*H01L 51/52* (2006.01)
*H01L 51/50* (2006.01)

(52) U.S. Cl.
CPC ...... *H01L 27/3206* (2013.01); *H01L 27/3211* (2013.01); *H01L 51/5012* (2013.01); *H01L 51/5056* (2013.01); *H01L 51/5072* (2013.01); *H01L 51/5265* (2013.01); *H01L 27/3246* (2013.01); *H01L 2251/558* (2013.01)

(58) Field of Classification Search
CPC . H01L 27/3241–3297; H01L 51/50–56; H01L 51/0032–0095; H01L 27/3202–3204; H01L 27/3206; H01L 27/3209; H01L 27/3225–3234; H01L 27/3246; H01L 2251/558

See application file for complete search history.

(56) References Cited

U.S. PATENT DOCUMENTS

| | | | |
|---|---|---|---|
| 2009/0121239 A1* | 5/2009 | Asaki | H01L 51/5265 257/89 |
| 2012/0104423 A1* | 5/2012 | Kurata | H01L 51/5265 257/88 |
| 2012/0112173 A1 | 5/2012 | Matsumoto et al. | |

(Continued)

FOREIGN PATENT DOCUMENTS

| | | |
|---|---|---|
| JP | 2012104525 A | 5/2012 |
| JP | 2012156075 A | 8/2012 |
| JP | 2017-72812 A | 4/2017 |

*Primary Examiner* — Cuong B Nguyen
(74) *Attorney, Agent, or Firm* — Hauptman Ham, LLP

(57) ABSTRACT

An organic electroluminescent element includes, in order, an anode, an organic layer including a light-emitting layer, and a cathode. The organic layer further includes a first organic layer that is provided between the light-emitting layer and the anode, and includes a hole transport layer. The hole transport layer includes a material having an absorption coefficient of 0.01 or greater and 0.06 or less. The light-emitting layer has a light-emitting center receding from a first interface of the light-emitting layer by a thickness greater than 0 and equal to or less than 0.4, where the light-emitting layer has a thickness of 1. The first interface is adjacent to the anode. The organic electroluminescent element further includes a microcavity structure in which the position of the interface is a resonance point.

17 Claims, 12 Drawing Sheets

(56) References Cited

U.S. PATENT DOCUMENTS

2015/0194623 A1     7/2015   Pyo et al.
2017/0104036 A1     4/2017   Maeda
2018/0182990 A1*   6/2018   Youn .................. H01L 51/5278

* cited by examiner

| | LAYER | 12r | 12g | 12b |
| --- | --- | --- | --- | --- |
| | | 2nd-1 Cav. | 2nd-1 Cav. | 2nd-1 Cav. |
| IDEAL OPTICAL CONFIGURATION | UPPER LAYER | 250 | 215 | 170 |
| | LOWER LAYER | 60 | 50 | 180 |
| ACTUAL ELEMENT CONFIGURATION | CATHODE | 15 | | |
| | ELECTRON TRANSPORT LAYER, ELECTRON INJECTION LAYER | 170 | | |
| | LIGHT-EMITTING LAYER | 80 | 45 | 50 |
| | HOLE TRANSPORT LAYER, HOLE INJECTION LAYER | 60 | 50 | 130 |
| | ANODE | 200 | | |

|  | LAYER | 12r | 12g | 12b |
|---|---|---|---|---|
|  |  | 2nd-1 Cav. | 2nd-1 Cav. | 2nd-1 Cav. |
| IDEAL OPTICAL CONFIGURATION | UPPER LAYER | 250 | 215 | 170 |
|  | LOWER LAYER | 60 | 50 | 180 |
| ACTUAL ELEMENT CONFIGURATION | CATHODE | 15 | | |
|  | ELECTRON TRANSPORT LAYER, ELECTRON INJECTION LAYER | 120 | | |
|  | LIGHT-EMITTING LAYER | 130 ★ | 95 ★ | 50 ★ |
|  | HOLE TRANSPORT LAYER, HOLE INJECTION LAYER | 60 | 50 | 180 |
|  | ANODE | 200 | | |

| CAVITY STRUCTURE | 1st. | 2nd. | | 3rd. |
|---|---|---|---|---|
| | | 2nd.-1 | 2nd.-2 | |
| 12r | 83% | 100% | 71% | 94% |
| 12g | 85% | 100% | 78% | 98% |
| 12b | 71% | 88% | 77% | 100% |
FIG. 13
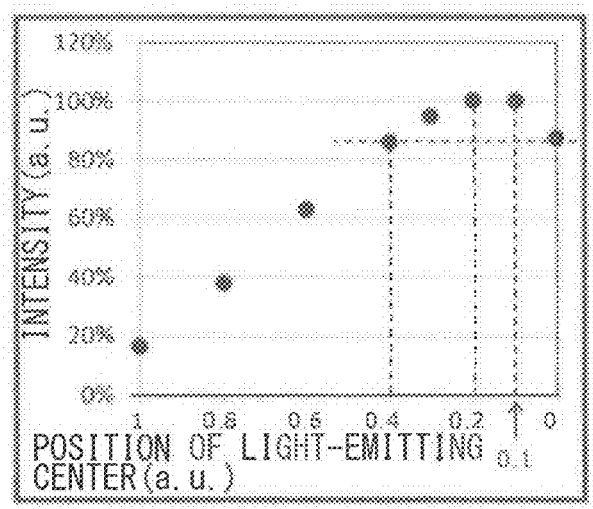
FIG. 14
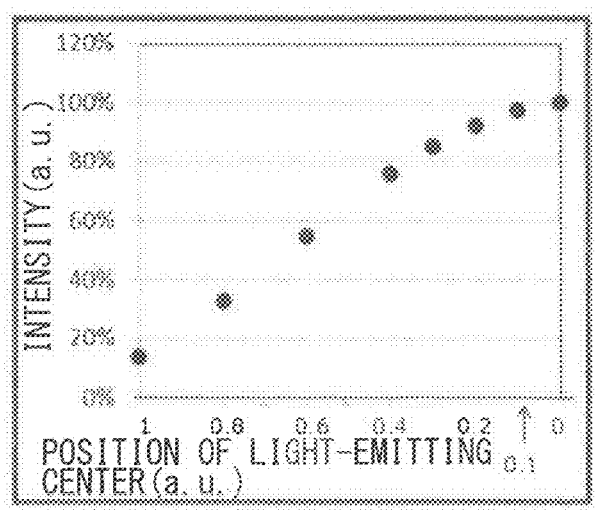
FIG. 15

ORGANIC ELECTROLUMINESCENT ELEMENT, ORGANIC ELECTROLUMINESCENT PANEL, ORGANIC ELECTROLUMINESCENT UNIT, AND ELECTRONIC APPARATUS

CROSS REFERENCE TO RELATED APPLICATIONS

This application claims the benefit of Japanese Priority Patent Application Nos. 2017-131260 filed on Jul. 4, 2017, and 2017-134603 filed on Jul. 10, 2017, the entire contents each of which are incorporated herein by reference.

BACKGROUND

The present disclosure relates to an organic electroluminescent element, an organic electroluminescent panel, an organic electroluminescent unit, and an electronic apparatus.

A variety of organic electroluminescent units, such as organic electroluminescent displays, including organic electroluminescent elements have been proposed, as described in Japanese Unexamined Patent Application Publication No. 2017-072812, for example.

SUMMARY

There has been a general demand for enhancing the performance of an organic electroluminescent element in an organic electroluminescent unit.

It is desired to provide an organic electroluminescent element with improved performance, and an organic electroluminescent panel, an organic electroluminescent unit, and an electronic apparatus that each include such an organic electroluminescent element.

An organic electroluminescent element according to one embodiment of the disclosure includes, in order, an anode, an organic layer including a light-emitting layer, and a cathode. The organic layer further includes a first organic layer that is provided between the light-emitting layer and the anode, and includes a hole transport layer that includes a material having an absorption coefficient of 0.01 or greater and 0.06 or less. The light-emitting layer has a light-emitting center receding from a first interface of the light-emitting layer by a thickness greater than 0 and equal to or less than 0.4, where the light-emitting layer has a thickness of 1. The first interface is adjacent to the anode. The organic electroluminescent element further includes a microcavity structure in which a position of the first interface is a resonance point.

An organic electroluminescent panel according to one embodiment of the disclosure includes a red pixel, a green pixel, and a blue pixel. The red pixel, the green pixel, and the blue pixel include respective organic electroluminescent elements. The organic electroluminescent elements each include, in order, an anode, an organic layer including a light-emitting layer, and a cathode. The organic layer of the red pixel or the green pixel or both further includes a first organic layer that is provided between the light-emitting layer and the anode. The first organic layer includes a hole transport layer that includes a material having an absorption coefficient of 0.01 or greater and 0.06 or less. The light-emitting layer in any of the pixel that includes the hole transport layer has a light-emitting center receding from a second interface of the light-emitting layer by a thickness greater than 0 and equal to or less than 0.4, where the light-emitting layer has a thickness of 1. The second interface is adjacent to the hole transport layer. The organic electroluminescent element in any of the red pixel and the green pixel that includes the hole transport layer further includes a microcavity structure in which a position of the second interface is a resonance point.

An organic electroluminescent unit according to one embodiment of the disclosure includes an organic electroluminescent panel and a driving circuit configured to drive the organic electroluminescent panel. The organic electroluminescent panel includes a red pixel, a green pixel, and a blue pixel. The red pixel, the green pixel, and the blue pixel include respective organic electroluminescent elements. The organic electroluminescent elements each include, in order, an anode, an organic layer including a light-emitting layer, and a cathode. The organic layer of one or more of the red pixel, the green pixel, and the blue pixel further includes a first organic layer that is provided between the light-emitting layer and the anode. The first organic layer includes a hole transport layer that includes a material having an absorption coefficient of 0.01 or greater and 0.06 or less. The light-emitting layer in any of the red pixel, the green pixel, and the blue pixel that includes the hole transport layer has a light-emitting center receding from a second interface of the light-emitting layer by a thickness greater than 0 and equal to or less than 0.4, where the light-emitting layer has a thickness of 1. The second interface is adjacent to the hole transport layer. The organic electroluminescent element in any of the red pixel, the green pixel, and the blue pixel that includes the hole transport layer further includes a microcavity structure in which a position of the second interface is a resonance point.

An electronic apparatus according to one embodiment of the disclosure is provided with an organic electroluminescent unit. The organic electroluminescent unit includes an organic electroluminescent panel and a driving circuit configured to drive the organic electroluminescent panel. The organic electroluminescent panel includes a red pixel, a green pixel, and a blue pixel. The red pixel, the green pixel, and the blue pixel include respective organic electroluminescent elements. The organic electroluminescent elements each include, in order, an anode, an organic layer including a light-emitting layer, and a cathode. The organic layer of one or more of the red pixel, the green pixel, and the blue pixel further includes a first organic layer that is provided between the light-emitting layer and the anode. The first organic layer includes a hole transport layer that includes a material having an absorption coefficient of 0.01 or greater and 0.06 or less. The light-emitting layer in any of the red pixel, the green pixel, and the blue pixel that includes the hole transport layer has a light-emitting center receding from a second interface of the light-emitting layer by a thickness greater than 0 and equal to or less than 0.4, where the light-emitting layer has a thickness of 1. The second interface is adjacent to the hole transport layer. The organic electroluminescent element in any of the red pixel, the green pixel, and the blue pixel that includes the hole transport layer further includes a microcavity structure in which a position of the second interface is a resonance point.

An organic electroluminescent panel according to one embodiment of the disclosure includes a red pixel, a green pixel, and a blue pixel. The red pixel, the green pixel, and the blue pixel include respective organic electroluminescent elements. The organic electroluminescent elements each include a microcavity structure. The microcavity structure of the red pixel has an optical path length that causes a second cavity. The microcavity structure of the green pixel has an optical path length that causes the second cavity. The microcavity structure of the blue pixel has an optical path length that causes a third cavity.

An organic electroluminescent unit according to one embodiment of the disclosure includes an organic electroluminescent panel and a driving circuit configured to drive the organic electroluminescent panel. The organic electroluminescent panel includes a red pixel, a green pixel, and a blue pixel. The red pixel, the green pixel, and the blue pixel include respective organic electroluminescent elements. The organic electroluminescent elements each include a microcavity structure. The microcavity structure of the red pixel has an optical path length that causes a second cavity. The microcavity structure of the green pixel has an optical path length that causes the second cavity. The microcavity structure of the blue pixel has an optical path length that causes a third cavity.

An electronic apparatus according to one embodiment of the disclosure is provided with an organic electroluminescent unit. The organic electroluminescent unit includes an organic electroluminescent panel and a driving circuit configured to drive the organic electroluminescent panel. The organic electroluminescent panel includes a red pixel, a green pixel, and a blue pixel. The red pixel, the green pixel, and the blue pixel include respective organic electroluminescent elements. The organic electroluminescent elements each include a microcavity structure. The microcavity structure of the red pixel has an optical path length that causes a second cavity. The microcavity structure of the green pixel has an optical path length that causes the second cavity. The microcavity structure of the blue pixel has an optical path length that causes a third cavity.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

FIG. 13 is a table of exemplary numerical values for the intensity map of FIG. 12.

FIG. 14 is a graph illustrating an exemplary correlation between a position of a light-emitting center and the light extraction intensity in the organic electroluminescent element of FIG. 7.

FIG. 15 is a graph illustrating an exemplary correlation between a position of a light-emitting center and the light extraction intensity in the organic electroluminescent element according to a comparative example.

DETAILED DESCRIPTION

Figure 1:
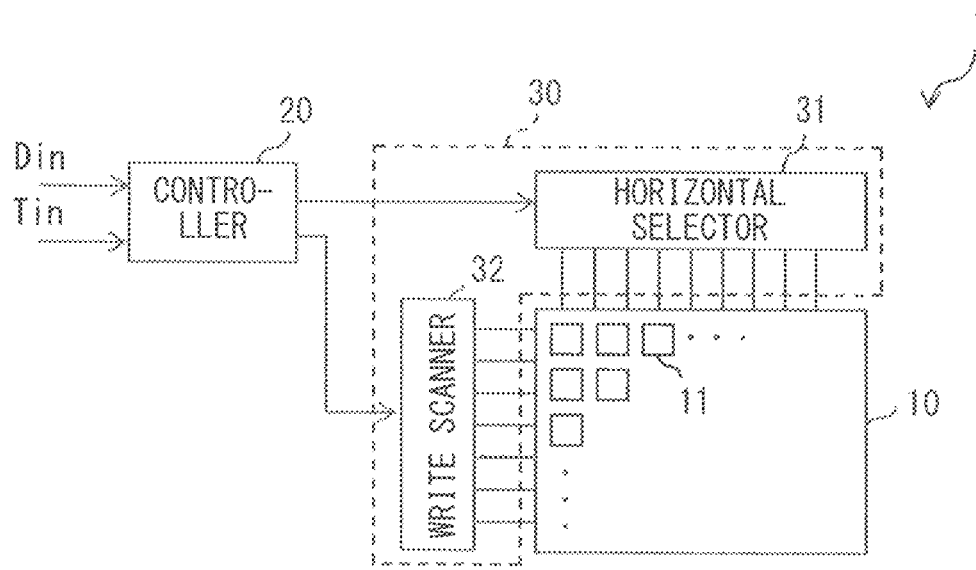
FIG. 1 schematically illustrates an exemplary configuration of an organic electroluminescent unit according to one embodiment of the disclosure.

In the following, some example embodiments of the disclosure are described in detail, in the following order, with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail.

1. EMBODIMENTS

[Configuration]

Figure 2:
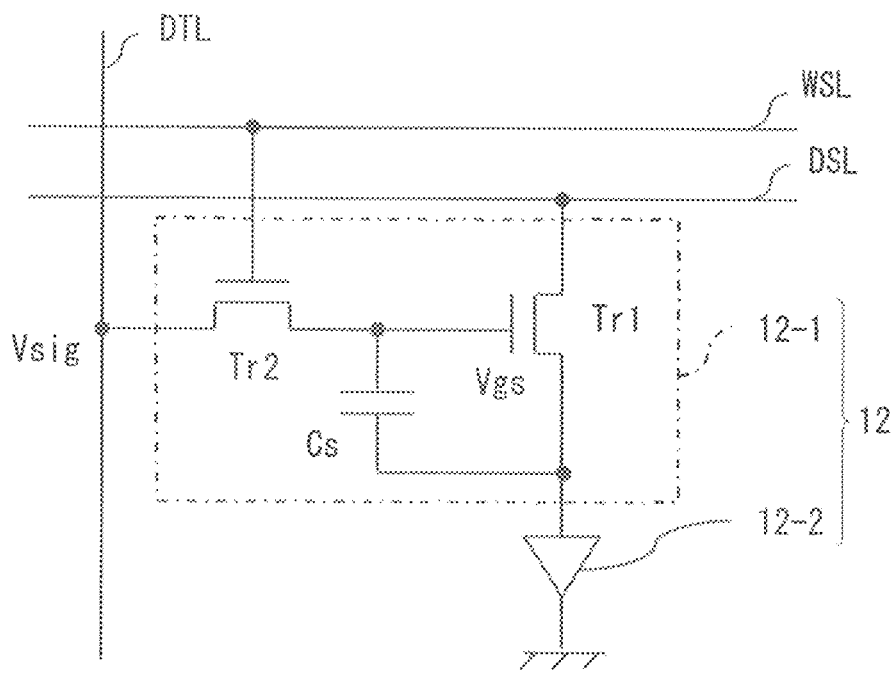
FIG. 2 illustrates an exemplary circuit configuration of a sub-pixel in each pixel illustrated in FIG. 1.

FIG. 1 schematically illustrates an exemplary configuration of an organic electroluminescent unit 1 according to one embodiment of the disclosure. FIG. 2 illustrates an exemplary circuit configuration of a sub-pixel 12 in each pixel 11 in the organic electroluminescent unit 1. The organic electroluminescent unit 1 includes, for example, an organic electroluminescent panel 10, a controller 20, and a driver 30. The driver 30 may be mounted on an outer edge of the organic electroluminescent panel 10, for example. The organic electroluminescent panel 10 may include multiple pixels 11 arranged in matrix. The controller 20 and the driver 30 may drive the organic electroluminescent panel 10 (i.e., pixels 11) on the basis of an external image signal Din and an external synchronizing signal Tin.

[Organic Electroluminescent Panel 10]

In response to the active-matrix driving of the pixels 11 performed by the controller 20 and the driver 30, the organic electroluminescent panel 10 may display an image based on the external image signal Din and the external synchronizing signal Tin. The organic electroluminescent panel 10 may include multiple scanning lines WSL and multiple power lines DSL both extending in a row direction, multiple signal lines DTL extending in a column direction, and the multiple pixels 11 arranged in matrix.

The scanning lines WSL may be used to select the pixels 11. In detail, the scanning lines WSL may supply a selection pulse to the pixels 11 to select the pixels 11 on a predetermined unit basis. For example, the pixels 11 may be selected on a pixel-row basis. The signal lines DTL may supply, to the respective pixels 11, a signal voltage Vsig corresponding to the image signal Din. In detail, the signal lines DTL may supply, to the respective pixels 11, a data pulse including the signal voltage Vsig. The power lines DSL may supply electric power to the pixels 11.

Each of the pixels 11 may include a sub-pixel 12 emitting red light, a sub-pixel 12 emitting green light, and a sub-pixel 12 emitting blue light. Optionally, each of the pixels 11 may further include a sub-pixel 12 emitting light in another color, such as white or yellow, for example. The sub-pixels 12 in each pixel 11 may be aligned in line in a predetermined direction, for example.

The signal lines DTL may be each coupled to an output end of a horizontal selector 31 described below. Each of the signal lines DTL may be assigned to a corresponding pixel column, for example. The scanning lines WSL may be each coupled to an output end of a write scanner 32 described below. Each of the scanning lines WSL may be assigned to a corresponding pixel row, for example. The power lines DSL may be each coupled to an output end of a power source. Each of the power lines DSL may be assigned to a corresponding pixel row, for example.

The sub-pixels 12 may each include a pixel circuit 12-1 and an organic electroluminescent element 12-2. The configuration of the organic electroluminescent element 12-2 is described below.

The pixel circuit 12-1 may control light emission and light extinction of the organic electroluminescent element 12-2. The pixel circuit 12-1 may hold a voltage written into the corresponding sub-pixel 12 through write scanning described below. The pixel circuit 12-1 may include a driving transistor Tr1, a switching transistor Tr2, and a storage capacitor Cs, for example.

The switching transistor Tr2 may control application of the signal voltage Vsig to a gate of the driving transistor Tr1. The signal voltage Vsig may be based on the image signal Din. In one embodiment, the switching transistor Tr2 may sample a voltage of the signal line DTL and write the sampled voltage into the gate of the driving transistor Tr1. The driving transistor Tr1 may be coupled in series to the organic electroluminescent element 12-2. The driving transistor Tr1 may drive the organic electroluminescent element 12-2. The driving transistor Tr1 may control an electric current flowing through the organic electroluminescent element 12-2 on the basis of the magnitude of the voltage sampled at the switching transistor Tr2. The storage capacitor Cs may hold a predetermined voltage between the gate and a source of the driving transistor Tr1. The storage capacitor Cs may retain a gate-source voltage Vgs of the driving transistor Tr1 at a constant level for a predetermined period. Note that the pixel circuit 12-1 may have a circuit configuration that includes the 2Tr1C circuit described above and additional capacitors and transistors. Alternatively, the pixel circuit 12-1 may have a circuit configuration different from that of the 2Tr1C circuit described above.

Each of the signal lines DTL may be coupled to an output end of the horizontal selector 31 described below and a source or a drain of the switching transistor Tr2. Each of the scanning lines WSL may be coupled to an output end of the write scanner 32 described below and a gate of the switching transistor Tr2. Each of the power lines DSL may be coupled to an output end of a power supply circuit and the source or a drain of the driving transistor Tr1.

The gate of the switching transistor Tr2 may be coupled to the corresponding scanning line WSL. One of the source or the drain of the switching transistor Tr2 may be coupled to the corresponding signal line DTL. The other of the source or the drain, which is not coupled to the signal line DTL, of the switching transistor Tr2 may be coupled to the gate of the driving transistor Tr1. One of the source or the drain of the driving transistor Tr1 may be coupled to the corresponding power line DSL. The other of the source or the drain, which is not coupled to the power line DSL, of the driving transistor Tr1 may be coupled to the anode 21 of the organic electroluminescent element 21-2. One end of the storage capacitor Cs may be coupled to the gate of the driving transistor Tr1. The other end of the storage capacitor Cs may be coupled to one of the source or the drain, adjacent to the organic electroluminescent element 21-2, of the driving transistor Tr1.

[Driver 30]

The driver 30 may include the horizontal selector 31 and the write scanner 32, for example. The horizontal selector 31 may apply the analog signal voltage Vsig to each of the signal lines DTL, in response to or in synchronization with a control signal, for example. The analog signal voltage Vsig may be transmitted from the controller 20. The write scanner 32 may scan the sub-pixels 12 on a predetermined unit basis.

[Controller 20]

Figure 3:
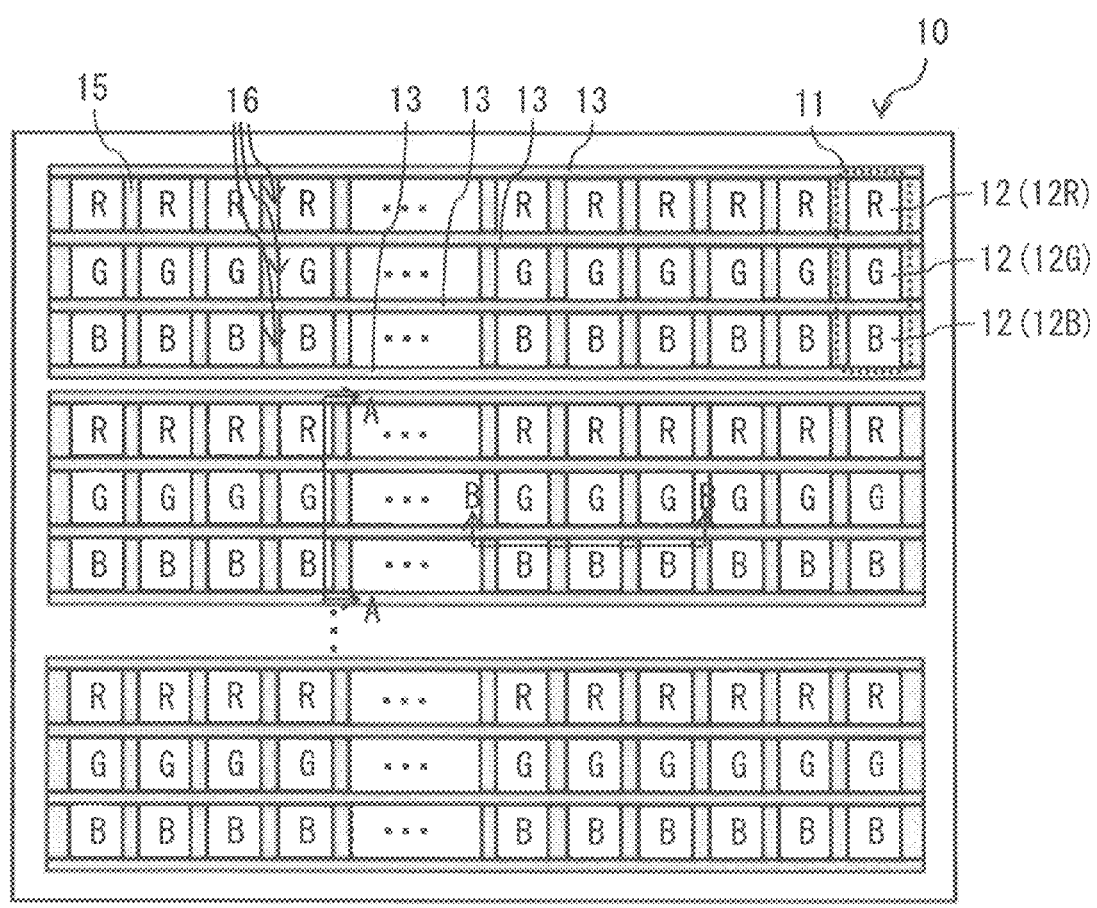
FIG. 3 illustrates an exemplary schematic configuration of an organic electroluminescent panel of FIG. 1.
Figure 4:
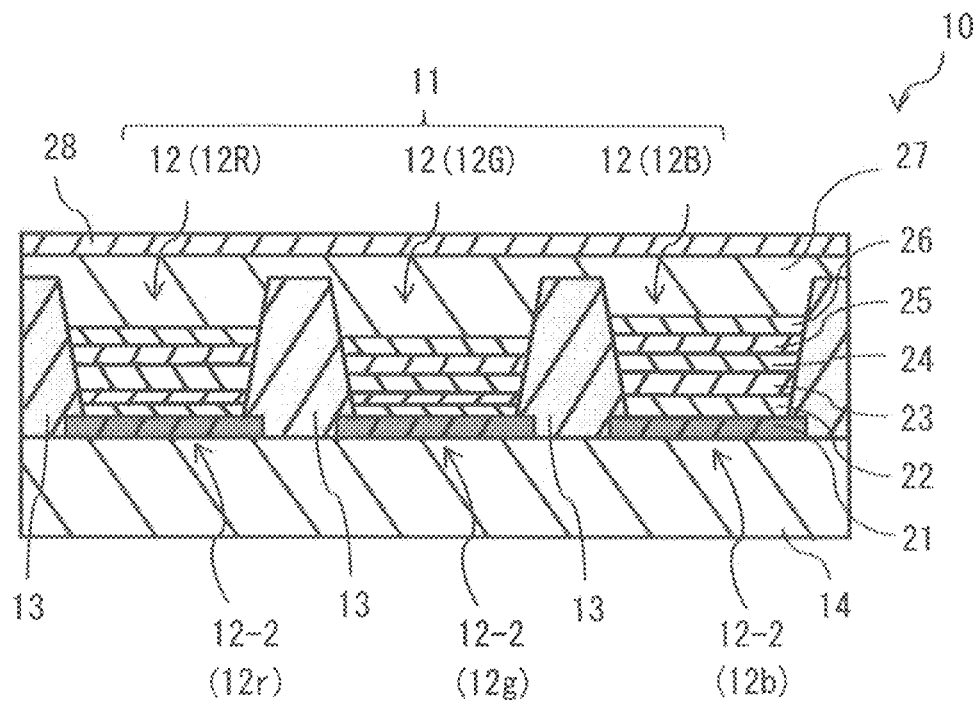
FIG. 4 illustrates an exemplary cross-sectional configuration of the organic electroluminescent panel of FIG. 3, taken along the line A-A of FIG. 3.
Figure 5:
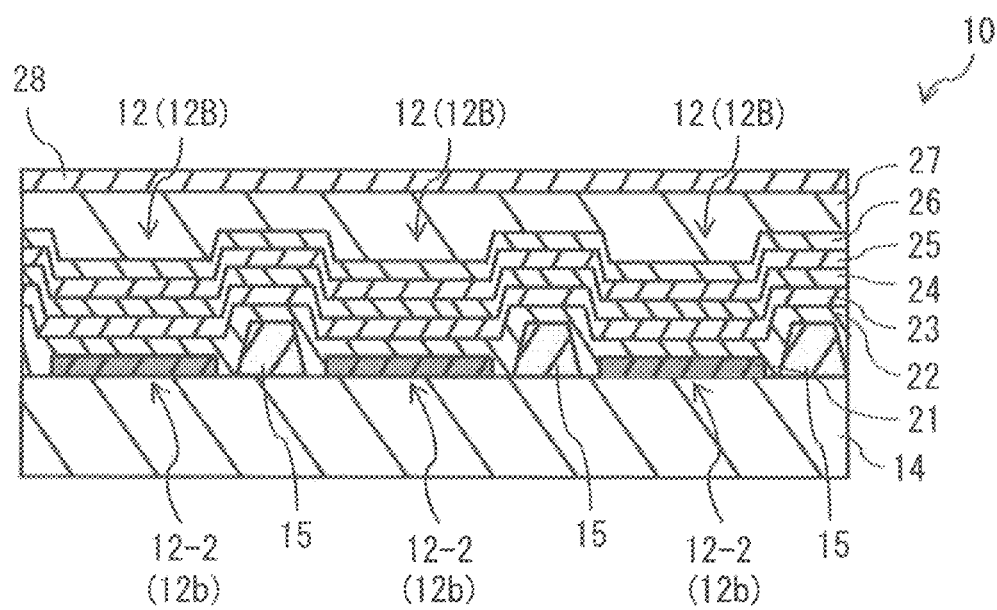
FIG. 5 illustrates an exemplary cross-sectional configuration of the organic electroluminescent panel of FIG. 3, taken along the line B-B of FIG. 3.

The controller 20 will now be described in detail. The controller 20 may perform predetermined correction on the digital image signal Din and generate the signal voltage Vsig on the basis of the image signal obtained through the predetermined correction, for example. The image signal Din may be transmitted from an external device, for example. The controller 20 may output the generated signal voltage Vsig to the horizontal selector 31, for example. The controller 20 may transmit a control signal to each circuit in the driver 30, in response to or in synchronization with the synchronizing signal Tin. The synchronizing signal may be transmitted from an external device, for example. The organic electroluminescent element 12-2 will now be described with reference to FIGS. 3, 4, and 5. FIG. 3 illustrates an exemplary schematic configuration of the organic electroluminescent panel 10. FIG. 4 illustrates an exemplary cross-sectional configuration of the organic electroluminescent panel 10 of FIG. 3, taken along the line A-A of FIG. 3. FIG. 5 illustrates an exemplary cross-sectional configuration of the organic electroluminescent panel 10 of FIG. 3, taken along the line B-B of FIG. 3.

The organic electroluminescent panel 10 includes the multiple pixels 11 arranged in matrix. In an exemplary embodiment, each of the pixels 11 may include the sub-pixel 12 emitting red light (hereinafter also referred to as sub-pixel 12R), the sub-pixel 12 emitting green light (hereinafter also referred to as sub-pixel 12G), and the sub-pixel 12 emitting blue light (hereinafter also referred to as sub-pixel 12B), as described above. The sub-pixel 12R may correspond to a specific but non-limiting example of a "red pixel" according to any embodiment of the disclosure. The sub-pixel 12G may correspond to a specific but non-limiting example of a "green pixel" according to any embodiment of the disclosure. The sub-pixel 12B may correspond to a specific but non-limiting example of a "blue pixel" according to any embodiment of the disclosure.

The sub-pixel 12R may include the organic electroluminescent element 12-2 emitting red light (hereinafter also referred to as organic electroluminescent element 12r). The sub-pixel 12G may include the electroluminescent element 12-2 emitting green light (hereinafter also referred to as organic electroluminescent element 12g). The sub-pixel 12B may include the organic electroluminescent element 12-2 emitting blue light (hereinafter also referred to as organic electroluminescent element 12b). The sub-pixels 12R, 12G, and 12B may be arranged in a stripe form, for example. The sub-pixels 12R, 12G, and 12B may be aligned in the column direction in each pixel 11, for example. The sub-pixels 12 emitting light in the same color are aligned in the row direction in each pixel row.

The organic electroluminescent panel 10 may include multiple line banks 13 extending in the row direction, and multiple banks 15 extending in the column direction, on a substrate 14. The line banks 13 and the banks 15 may serve as partitions among the sub-pixels 12. The line banks 13 may partition each pixel 11 into the sub-pixels 12. The banks 15 may partition each pixel row into the pixels 11. In other words, each sub-pixel 12 may be partitioned by the line banks 13 and the banks 15. Each bank 15 may be disposed between two line banks 13 adjacent to each other in the column direction. Opposite end portions of each bank 15 may be respectively coupled to the two line banks 13 adjacent to each other in the column direction.

The substrate 14 may include, for example, a base supporting the organic electroluminescent elements 12-2 and the line banks 13, and a wiring layer provided on the base. The base of the substrate 14 may include, for example, non-alkali glass, soda glass, nonfluorescent glass, phosphate glass, borate glass, or quartz. Alternatively, the base of the substrate 14 may include, for example, acrylic resin, styrene resin, polycarbonate resin, epoxy resin, polyethylene, polyester, silicone resin, or alumina. The wiring layer of the substrate 14 may include the pixel circuits 12-1 of the pixels 11, for example.

The line banks 13 and the banks 15 may include, for example, an insulating organic material. Non-limiting examples of the insulating organic material may include acrylic resin, polyimide resin, and novolac phenol resin. In an exemplary embodiment, the line banks 13 and the banks 15 may include an insulating resin with thermal resistance and solvent resistance. The line banks 13 and the banks 15 may be formed by processing the insulating resin into desired patterns by photolithography and development, for example. The line banks 13 may each have a forward-tapered cross-sectional shape, for example, as illustrated in FIG. 4. Alternatively, the line banks 13 may each have an inversely-tapered cross-sectional shape tapering toward the substrate 14.

Each region defined by two adjacent line banks 13 parallel to each other and two opposite banks 15 may correspond to a groove 16. The organic electroluminescent elements 12-2 of the sub-pixels 12 may be each disposed in a gap between the two adjacent line banks 13 parallel to each other. In other words, the organic electroluminescent elements 12-2 of the sub-pixels 12 may be disposed in the respective grooves 16.

Each organic electroluminescent element 12-2 may include, for example, an anode 21, a hole injection layer 22, a hole transport layer 23, an organic light-emitting layer 24, an electron transport layer 25, an electron injection layer 26, and a cathode 27, in this order from the substrate 14. The hole transport layer 23 or a combination of the hole injection layer 22 and the hole transport layer 23 may correspond to a specific but non-limiting example of a "first organic layer" according to any embodiment of the the disclosure. The organic light-emitting layer 24 may correspond to a specific but non-limiting example of a "light-emitting layer" according to any embodiment of the disclosure. The electron transport layer 25 or a combination of the electron transport layer 25 and the electron injection layer 26 may correspond to a specific but non-limiting example of a "second organic layer" according to any embodiment of the disclosure. The hole injection layer 22 enhances efficiency in injecting holes. The hole transport layer 23 may transport, to the organic light-emitting layer 24, holes injected through the anode 21. The organic light-emitting layer 24 may emit light in a predetermined color through recombination of electrons and holes. The electron transport layer 25 may transport, to the organic light-emitting layer 24, electrons injected through the cathode 27. The electron injection layer 26 enhances efficiency in injecting electrons. The hole injection layer 22 and/or the electron injection layer 26 may be omitted. Optionally, each organic electroluminescent element 12-2 may include additional layers other than the layers described hereinabove.

The anode 21 may be provided on the substrate 14, for example. The anode 21 may be, for example but not limited to, a transparent electrode having translucency. In an exemplary embodiment, the anode 21 may be a transparent electrically-conductive film including a transparent electrically conductive material, such as indium tin oxide (ITO) or indium zinc oxide (IZO). In an alternative embodiment, the anode 21 may be an electrode including aluminum (Al), silver (Ag), an aluminum alloy, or a silver alloy, or may be a reflective electrode having light reflectivity. In still another embodiment, the anode 21 may be a laminate of the reflective electrode and the transparent electrode.

The hole transport layer 23 may transport, to the organic light-emitting layer 24, holes injected from the anode 21. For example, the hole transport layer 23 may be a coated film that is coated with a solution by application and drying of the solution. The solution may contain, as a main component of the solute, an organic material having a hole transporting property (hereinafter also referred to as "hole transporting material 23M"). In other words, the hole transport layer 23 may include the hole transporting material 23M as a main component. The solute or the hole transporting material 12M may have an insolubilizing property. The term "insolubilizing property" used herein refers to a property that allows an insolubilizing group such as a cross-linking group and thermal dissociation soluble group to be chemically transformed by irradiation with heat, ultraviolet rays, or a combination thereof, for example, thereby allowing the chemically transformed group to be insoluble to an organic solvent or water. The hole transport layer 23 may thus be an insolubilized hole transport layer.

Non-limiting examples of the hole transporting material 23M or the raw material of the hole transport layer 23 may include an arylamine derivative, a triazole derivative, an oxadiazole derivative, an imidazole derivative, a polyarylalkane derivative, a pyrazoline derivative, a pyrazolone derivative, a phenylenediamine derivative, an amino-substituted chalcone derivative, an oxazole derivative, a styrylanthracene derivative, a fluorenone derivative, a hydrazone derivative, a stilbene derivative, a butadiene compound, a polystyrene derivative, a triphenylmethane derivative, a tetraphenylbenzene derivative, and a combination thereof. For its solubility and insolubilizing property, the hole transporting material 23M may further contain, in a molecular structure thereof, a soluble group, a thermal dissociation soluble group, a cross-linking group, or an insolubilizing group such as a desorption protecting group.

The organic light-emitting layer 24 may emit light in a predetermined color through recombination of holes and electrons. For example, the organic light-emitting layer 24 may be a coated film that is coated with a solution by application and drying the solution. The solution may contain, as a main component of the solute, the organic material that emit light through generation of excitons caused by recombination of holes and electrons (hereinafter also referred to as "organic light-emitting material 24M"). In other words, the organic light-emitting layer 24 may include the organic light-emitting material 24M as a main component. The organic electroluminescent element 12r in the sub-pixel 12R may include the organic light-emitting material 24M containing an organic light-emitting material emitting red light. The organic electroluminescent element 12g in the sub-pixel 12G may include the organic light-emitting material 24M containing an organic light-emitting material emitting green light. The organic electroluminescent element 12b in the sub-pixel 12B may include the organic light-emitting material 24M containing an organic light-emitting material emitting blue light.

The organic light-emitting layer 24 may be an organic light-emitting monolayer or a laminate of several organic light-emitting layers, for example. In one embodiment where the organic light-emitting layer 24 is a laminate of several organic light-emitting layers, the organic light-emitting layers may include a common main component, for example. In this case, the organic light-emitting layers may be coated films that are coated with a solution by application and drying of the solution. The solution may contain the organic light-emitting material 24M as a main component of the solute.

In one embodiment, the raw material of the organic light-emitting layer 24 or the organic light-emitting material 24M may be a single dopant material, for example. In another embodiment, the organic light-emitting material 24M may be a combination of a host material and the dopant material. In other words, the organic light-emitting layer 24 may include the host material and the dopant material as the organic light-emitting material 24M. The host material may mainly serve to transport electrons and holes, and the dopant material may mainly serve to emit light. In still another embodiment, the organic light-emitting material 24M may include a combination of two or more host materials and two or more dopant materials. In one embodiment, the amount of the dopant material(s) relative to the host material(s) may be in a range from 0.01% by weight to 30% by weight. In another embodiment, the amount of the dopant material(s) relative to the host material(s) may from 0.01% by weight to 10% by weight.

Non-limiting examples of the host material of the organic light-emitting layer 24 may include an amine compound, a condensed polycyclic aromatic compound, and a heterocyclic compound. Non-limiting examples of the amine compound may include a monoamine derivative, a diamine derivative, a triamine derivative, and a tetraamine derivative. Non-limiting examples of the condensed polycyclic aromatic compound may include an anthracene derivative, a naphthalene derivative, a naphthacene derivative, a phenanthrene derivative, a chrysene derivative, a fluoranthene derivative, a triphenylene derivative, a pentacene derivative, and a perylene derivative. Non-limiting examples of the heterocyclic compound may include a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, and a phthalocyanine derivative.

Non-limiting examples of the dopant material of the organic light-emitting layer 24 may include a pyrene derivative, a fluoranthene derivative, an arylacetylene derivative, a fluorene derivative, a perylene derivative, an oxadiazole derivative, an anthracene derivative, and a chrysene derivative. Alternatively, the dopant material of the organic light-emitting layer 24 may be a metal complex. The metal complex may contain a ligand and an atom of metal, such as iridium (Ir), platinum (Pt), osmium (Os), gold (Au), rhenium (Re), or ruthenium (Ru).

The organic light-emitting material 24M of the organic electroluminescent element 12r in the sub-pixel 12R may include an organic light-emitting material having electron mobility higher than hole mobility. In other words, the organic light-emitting material 24M of the organic electroluminescent element 12r may have a high electron transporting property and the electron mobility higher than the hole mobility. This allows a light-emitting region 24A of the organic electroluminescent element 12r to reside in a portion adjacent to the hole transport layer 23. In one embodiment, the light-emitting region 24A of the organic electroluminescent element 12r may reside at or near an interface between the organic light-emitting layer 24 and the hole transport layer 23.

The organic light-emitting material 24M of the organic electroluminescent element 12g in the sub-pixel 12G may include an organic light-emitting material having electron mobility higher than hole mobility. In other words, the organic light-emitting material 24M of the organic electroluminescent element 12g may have a high electron transporting property and the electron mobility higher than the hole mobility. This allows a light-emitting region 24A of the organic electroluminescent element 12g to reside in a portion adjacent to the hole transport layer 23. In one embodiment, the light-emitting region 24A of the organic electroluminescent element 12g may reside at or near the interface between the organic light-emitting layer 24 and the hole transport layer 23.

The organic light-emitting material 24M of the organic electroluminescent element 12g in the sub-pixel 12B may include an organic light-emitting material having hole mobility higher than electron mobility. In other words, the organic light-emitting material 24M of the organic electroluminescent element 12b may have a high hole transporting property and the hole mobility higher than the electron mobility. This allows a light-emitting region 24A of the organic electroluminescent element 12b to reside in a portion adjacent to the electron transport layer 25. In one embodiment, the light-emitting region 24A of the organic electroluminescent element 12b may reside at or near an interface between the organic light-emitting layer 24 and the electron transport layer 25.

Figure 6A:
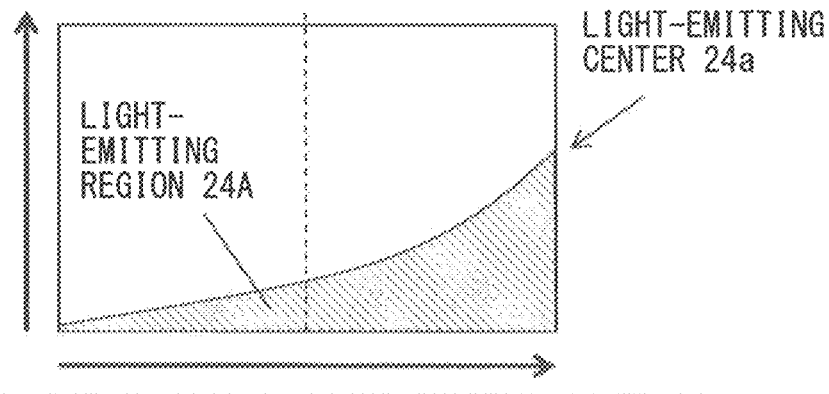
FIG. 6A is an exemplary profile of a light-emitting region generated in an organic light-emitting layer.
Figure 6B:
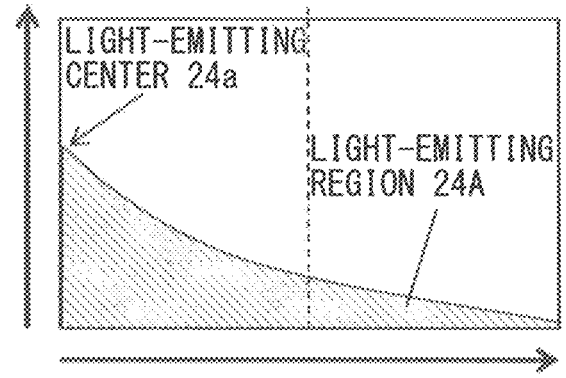
FIG. 6B is an exemplary profile of the light-emitting region generated in the organic light-emitting layer.

As used herein, the wording "the light-emitting region 24A may reside in a portion adjacent to the electron transport layer 25" refers to, for example, that 50% or more of the light-emitting region 24A in the organic light-emitting layer 24 resides in the portion adjacent to the electron transport layer 25, as in FIG. 6A. The wording "the light-emitting region may reside in a portion adjacent to the hole transport layer 23" refers to, for example, that 50% or more of the light-emitting region 24A in the organic light-emitting layer 24 resides in the portion adjacent to the hole transport layer 23, as in FIG. 6B.

Figure 6C:
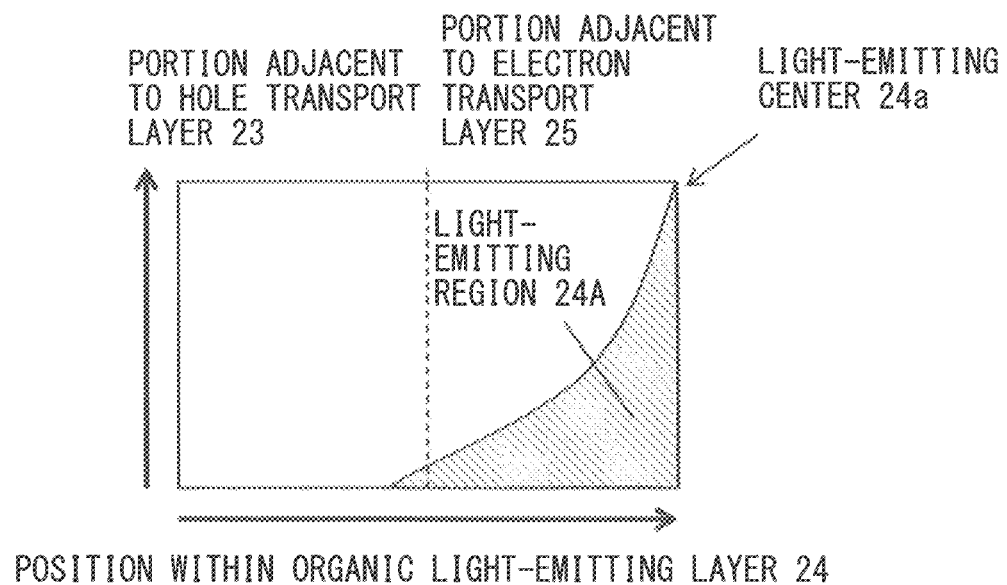
FIG. 6C is an exemplary profile of the light-emitting region generated in the organic light-emitting layer.
Figure 6D:
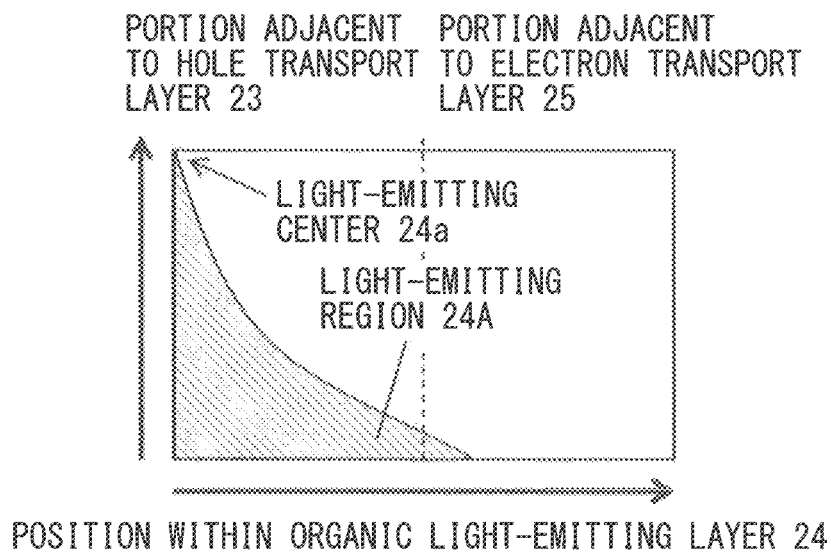
FIG. 6D is an exemplary profile of the light-emitting region generated in the organic light-emitting layer.

The wording "the light-emitting region 24A may reside at or near an interface between organic light-emitting layer 24 and the electron transport layer 25" refers to, for example, 90% or more of the light-emitting region 24A in the organic light-emitting layer 24 resides in the portion adjacent to the electron transport layer 25, as in FIG. 6C. The wording "the light-emitting region 24A may reside at or near an interface between the organic light-emitting layer 24 and the hole transport layer 23" refers to, for example, 90% or more of the light-emitting region 24A in the organic light-emitting layer 24 resides in the portion adjacent to the hole transport layer 23, as in FIG. 6D. Note that the light-emitting regions 24A illustrated in FIGS. 6A to 6D are mere examples. In an alternative embodiment, a peak or light-emitting center 24a of the light-emitting region 24A may position in an internal portion of the organic light-emitting layer 24 instead of at or near the interface of the organic light-emitting layer 24. The profile of the light-emitting layer 24 and the position of the peak or the light-emitting center of the light-emitting region 24A may be changed by controlling the ratio between the host material and the dopant material that are contained in the organic light-emitting layer 24, for example.

The electron transport layer 25 may transport, to the organic light-emitting layer 24, electrons injected through the cathode 27. The electron transport layer 25 may be, for example, a vapor-deposited film or a sputtered film. The electron transport layer 25 may include, as a main component, an organic material having the electron transporting property (hereinafter also referred to as "electron transporting material 25M"). In one embodiment, the electron transport layer 25 may include an organic material having a wide energy gap that appropriately suppresses or prevents hole-blocking characteristics and deactivation of excitons. The energy gap of the organic material of the electron transport layer 25 may be wider than that of the organic light-emitting layer 24.

The energy gap may refer to a difference between the the highest occupied molecular orbital (HOMO) level and the lowest unoccupied molecular orbital (LUMO) level. The energy gap may also be referred to as a band gap. The HOMO level may be measured by means of atmospheric photoelectron spectroscopy, an electrochemical method, such as cyclic voltammetry, or photoelectron spectroscopy (PES), for example. The LUMO level may be measured by means of inverse photoelectron spectroscopy (IPES) or calculation from an energy gap and a HOMO level that are determined based on absorption edges by optical absorption spectroscopy, for example. Alternatively, the HOMO and LUMO levels may be measured by means of molecular orbital calculation.

The electron transport layer 25 may be disposed between the organic light-emitting layer 24 and the cathode 27. The electron transport layer 25 may transfer, to the organic light-emitting layer 24, electrons injected from the cathode 27. In one embodiment, the electron transport layer 25 may further have a charge-blocking property to suppress tunneling of charges (i.e., holes in the present embodiment) from the organic light-emitting layer 24 to the cathode 27 and a property to suppress light extinction of the organic light-emitting layer 24 in an excitation state. The raw material of the electron transport layer 25 or the electron transporting material 25M may be an aromatic heterocyclic compound containing one or more hetero atoms in a molecule, for example. The aromatic heterocyclic compound may contain, as a skeleton, a pyridine ring, a pyrimidine ring, a triazine ring, a benzimidazole ring, a phenanthroline ring, or a quinazoline ring, for example. Optionally, the electron transport layer 25 may also contain a metal having an electron transporting property. The electron transport layer 25 containing the metal having the electron transporting property exhibits an enhanced electron transporting property. Non-limiting examples of the metal contained in the electron transport layer 25 may include barium (Ba), lithium (Li), calcium (Ca), potassium (K), cesium (Cs), sodium (Na), rubidium (Rb), and ytterbium (Yb).

The cathode 27 may be, for example but not limited to, a reflective electrode having light reflectivity. In one embodiment, the cathode 27 may be a metal electrode including a metal material having light reflectivity. Non-limiting examples of the material of the cathode 27 may include aluminum (Al), magnesium (Mg), silver (Ag), an aluminum-lithium alloy, and a magnesium-silver alloy. In another embodiment, the cathode 27 may be a transparent electrode, such as an ITO film, as with the anode 21. In an embodiment where the substrate 14 and the anode 21 may have translucency and the cathode 27 may have light reflectivity, the organic electroluminescent element 12-2 may have a bottom emission structure that emits light through the substrate 14. In another embodiment where the anode 21 may have light reflectivity and the cathode 27 may have translucency, the organic electroluminescent element 12-2 may have a top emission structure.

The organic electroluminescent panel 10 may further include, for example, a sealing layer 28 that seals the organic electroluminescent elements 12-2. In an exemplary embodiment, the sealing layer 28 may be in contact with a surface of the cathode 27 of each organic electroluminescent element 12-2.

Figures 7, 8:
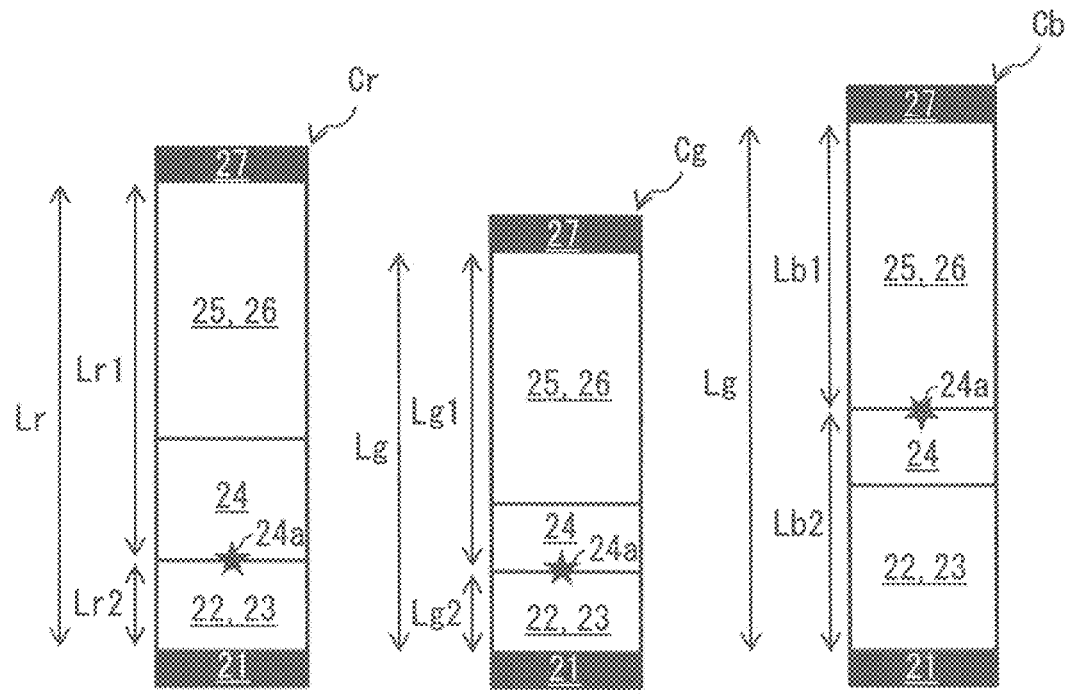
FIG. 7 schematically illustrates sub-pixels in each organic electroluminescent element of FIG. 4.
FIG. 8 is a table of exemplary thicknesses of respective layers in the organic electroluminescent element of FIG. 7.
Figures 9, 10:
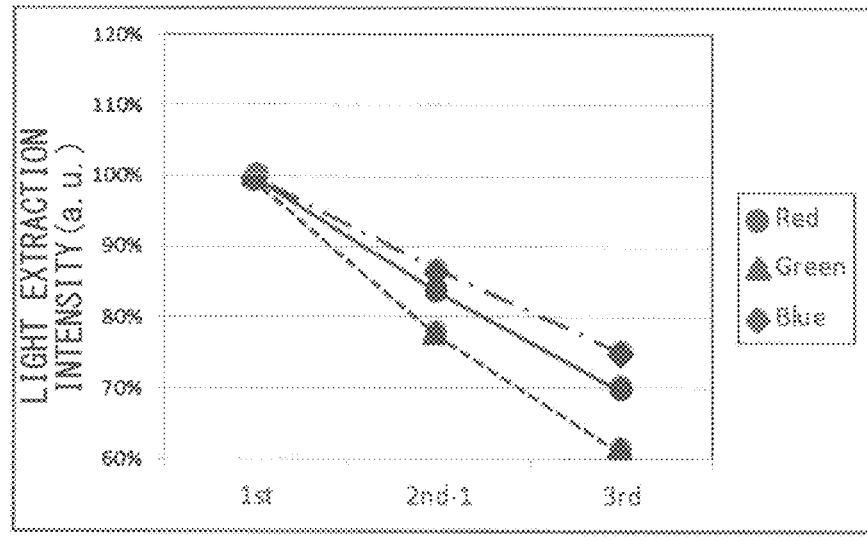
FIG. 9 is a table of exemplary thicknesses of respective layers in an organic electroluminescent element of a comparative example.
FIG. 10 is a graph illustrating an exemplary correlation between a cavity order and light extraction intensity.
Figure 11:
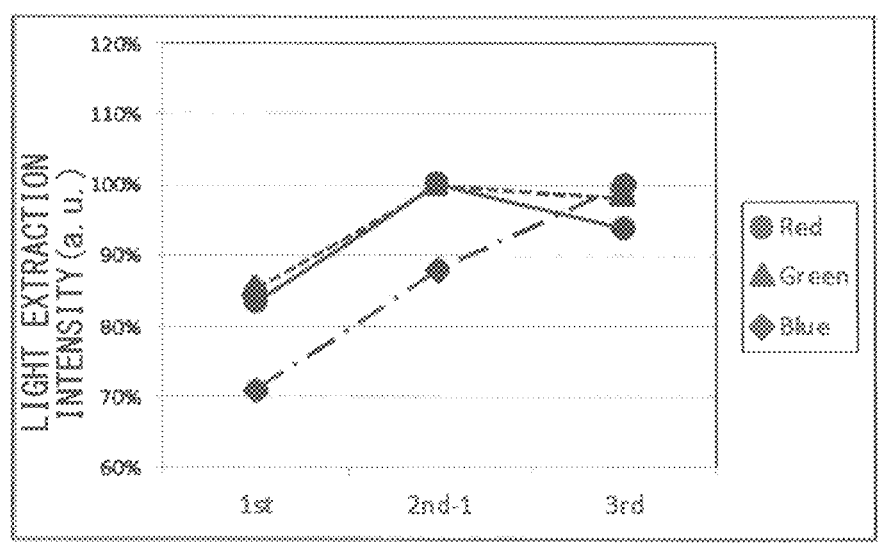
FIG. 11 is a graph illustrating an exemplary correlation between a cavity order and light extraction intensity.
Figure 12:
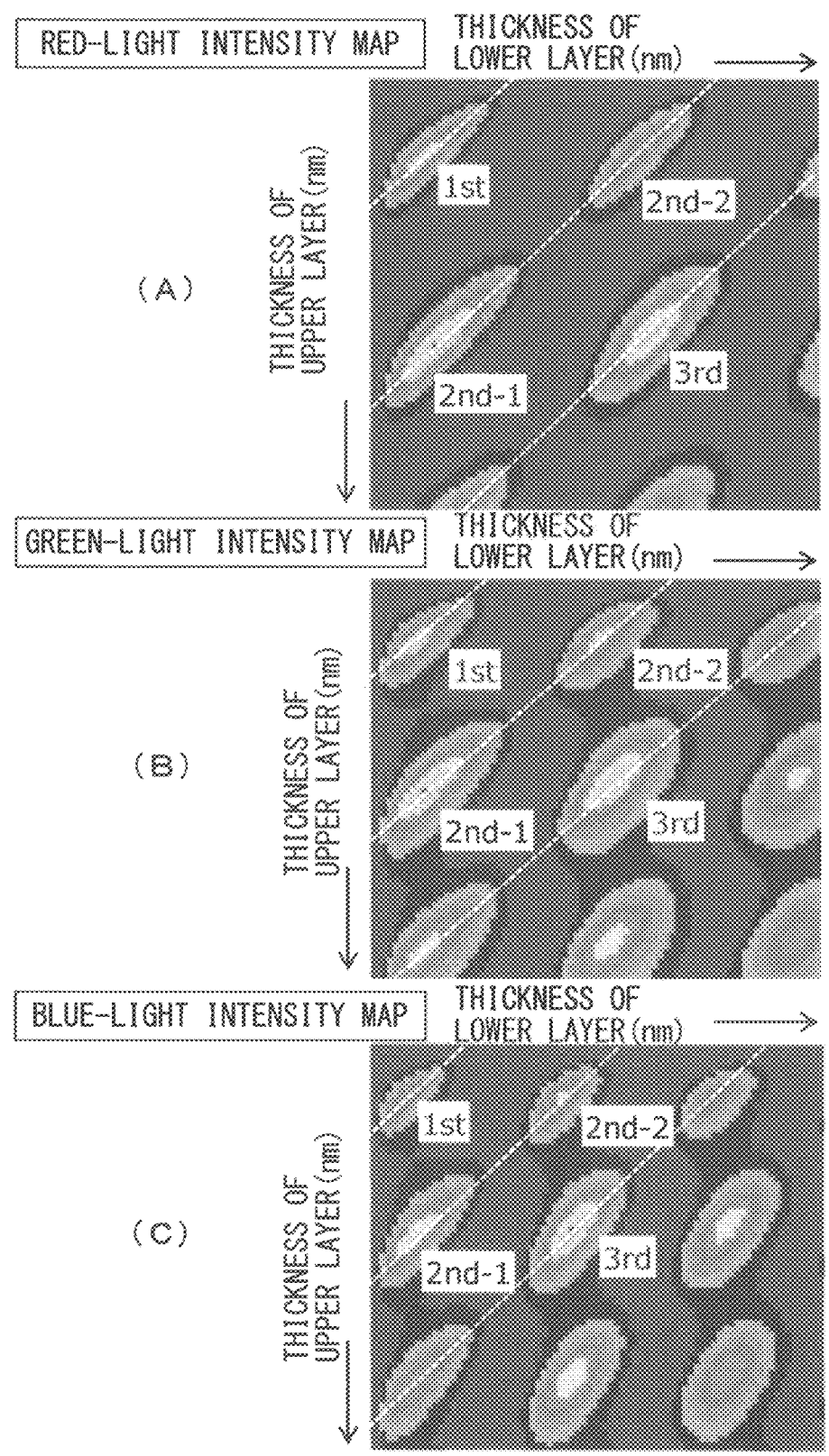
FIG. 12 is an exemplary intensity map of the organic electroluminescent element according to one embodiment of the disclosure.

Some characteristics of the organic electroluminescent element 12-2 according to an embodiment of the disclosure will now be described with reference to a comparative example. FIG. 7 schematically illustrates the organic electroluminescent elements 12-2 in the respective sub-pixels 12R, 12G, and 12B. FIG. 8 is a table of exemplary thicknesses of the respective layers in the organic electroluminescent element 12-2 of FIG. 7. FIG. 9 is a table of exemplary thicknesses of the respective layers in an organic electroluminescent element of a comparative example. FIGS. 10 and 11 each illustrate an exemplary correlation between a cavity order and light extraction intensity. FIG. 12 is an exemplary intensity map of the organic electroluminescent element 12-2. (A) of FIG. 12 is an exemplary intensity map of the organic electroluminescent element 12-2 in the sub-pixel 12R. (B) of FIG. 12 is an exemplary intensity map of the organic electroluminescent element 12-2 in the sub-pixel 12G. (C) of FIG. 12 is an exemplary intensity map of the organic electroluminescent element 12-2 in the sub-pixel 12B. FIG. 13 is a table of exemplary numerical values for the intensity map of FIG. 12.

The organic electroluminescent elements 12-2 in the respective sub-pixels 12R, 12G, and 12B have respective microcavity structures. The organic electroluminescent element 12-2 in the sub-pixel 12R, which is illustrated on the left side of FIG. 7, includes an exemplary microcavity structure Cr. The organic electroluminescent element 12-2 in the sub-pixel 12G, which is illustrated in the middle of FIG.

7, includes an exemplary microcavity structure Cg. In the microcavity structures Cr and Cg illustrated in FIG. 7, a layer including the hole injection layer 22 and the hole transport layer 23 may correspond to a specific but non-limiting example of the "first organic layer" according to any embodiment of the the disclosure. In the microcavity structures Cr and Cg illustrated in FIG. 7, a layer including the electron transport layer 25 and the electron injection layer 26 may correspond to a specific but non-limiting example of the "second organic layer". Note that the hole injection layer 22 in FIG. 7 may be omitted. Also note that the electron injection layer 26 in FIG. 7 may be omitted. In an embodiment where part of or the entire hole injection layer 22 may include an inorganic material in the microcavity structure Cr or Cg illustrated in FIG. 7, the organic-material-based portion of the layer including the hole injection layer 22 and the hole transport layer 23 may correspond to a specific but non-limiting example of the "first organic layer" according to any embodiment of the disclosure. The organic electroluminescent element 12-2 in the sub-pixel 12B, which is illustrated on the right side of FIG. 7, includes an exemplary microcavity structure Cb. The microcavity structures Cr, Cg, and Cb intensify light having a predetermined wavelength by utilizing, for example, optical resonance between the anode 21 and the cathode 27. Light emitted from the organic light-emitting layer 24 is multiply reflected between the anode 21 and the cathode 27. This strengthens a predetermined wavelength component in the light emitted from the organic light-emitting layer 24.

In one embodiment of the disclosure, the sub-pixels 12R, 12G, and 12B respectively emit light with different wavelengths. Accordingly, an optical path length between the anode 21 and the cathode 27 may correspond to an emission spectrum peak wavelength of each color. Light emitted from the organic light-emitting layer 24 in the microcavity structure Cr, Cg, or Cb is repeatedly reflected within a predetermined range of the optical path length between the anode 21 and the cathode 27. Light having a wavelength corresponding to the optical path length is intensified by resonance, while light not corresponding to the optical path length is attenuated. As a result, steep and high-intensity spectrum light is extracted to the outside, which increases luminance and color purity.

The microcavity structures may be more likely to cause a first-order interference, a second-order interference (second cavity), and a third-order interference (third cavity) with an increase in thickness of the layers. The first-order interference may correspond to a specific but non-limiting example of a "first cavity" according to any embodiment of the disclosure. The second-order interference may correspond to a specific but non-limiting example of a "second cavity" according to any embodiment of the disclosure. The third-order interference may correspond to a specific but non-limiting example of a "third cavity" according to any embodiment of the disclosure. The microcavity structures Cr and Cg each have an optical path length that causes the second cavity. In contrast, the microcavity structure Cb has an optical path length that causes the third cavity. In the microcavity structure Cr, a distance Lr between the anode 21 and the cathode 27 is an optical path length that causes the second cavity in a wavelength of red light emitted from the light-emitting center 24a of the organic light-emitting layer 24 in the sub-pixel 12R. In other words, a resonance point in the microcavity structure Cr is the position of the light-emitting center 24a. In the microcavity structure Cg, a distance Lg between the anode 21 and the cathode 27 is an optical path length that causes the second cavity in a wavelength of green light emitted from the light-emitting center 24a of the organic light-emitting layer 24 in the sub-pixel 12G. In other words, a resonance point in the microcavity structure Cg is the position of the light-emitting center 24a. In the microcavity structure Cb, a distance Lg between the anode 21 and the cathode 27 is an optical path length that causes the third cavity in a wavelength of blue light emitted from the light-emitting center 24a of the organic light-emitting layer 24 in the sub-pixel 12B. In other words, a resonance point in the microcavity structure Cb is the position of the light-emitting center 24a.

In one embodiment of the disclosure, the electron transport layer 25 may be common among the sub-pixels 12R, 12G, and 12B. The electron transport layer 25 may be collectively formed in the sub-pixels 12R, 12G, and 12B by vapor deposition or sputtering. In the sub-pixels 12R and 12G, the hole injection layers 22, the hole transport layers 23, the organic light-emitting layers 24, the electron transport layer 25, and the electron injection layers 26 each have a thickness that is adjusted to cause the distances Lr and Lg between the anode 21 and the cathode 27 to be the optical path lengths that cause the second cavity. In the sub-pixel 12B, the hole injection layer 22, the hole transport layer 23, the organic light-emitting layer 24, the electron transport layer 25, and the electron injection layer 26 may each have a thickness that is adjusted to cause the distance Lb between the anode 21 and the cathode 27 to be the optical path length that causes the third cavity.

The distance between the anode 21 and the light-emitting center 24a and the distance between the cathode 27 and the light-emitting center 24a may be crucial for the design of the organic electroluminescent element 12-2. In a strict sense, a reference point for these distances may be a position at which radiative recombination occurs.

FIG. 8 is a table of exemplary thicknesses of the respective layers in an embodiment where the light-emitting center 24a may reside at a position within the organic light-emitting layer 24 and adjacent to the hole transport layer 23, in the sub-pixels 12R and 12G, and the light-emitting center 24a may reside at the position within the organic light-emitting layer 24 and adjacent to the electron transport layer 25, in the sub-pixel 12B. The unit of each thickness in FIG. 8 is a nanometer (nm). Described in the upper rows of the table in FIG. 8 are ideal thicknesses of a layer above the light-emitting center 24a (hereinafter also referred to as upper layer) and a layer below the light-emitting center 24a (hereinafter also referred to as lower layer) in each microcavity structure.

In the sub-pixel 12R, the upper layer may have an ideal thickness Lr1 of 250 nm, and the lower layer may have an ideal thickness Lr2 of 60 nm. The thickness Lr1 may correspond to a specific but non-limiting example of a "second distance" according to any embodiment of the disclosure, and the thickness Lr2 may correspond to a specific but non-limiting example of a "first distance" of any embodiment of the disclosure. The thicknesses Lr1 and Lr2 each correspond to an optical path length that causes resonance of light emitted from the light-emitting center 24a with the microcavity structure Cr. In the sub-pixel 12G, the upper layer may have an ideal thickness Lg1 of 215 nm, and the lower layer may have an ideal thickness Lg2 of 50 nm. The thicknesses Lg1 and Lg2 each correspond to an optical path length that causes resonance of light emitted from the light-emitting center 24a with the microcavity structure Cg. The thickness Lg1 may correspond to a specific but non-limiting example of the "second distance" of any embodiment of the disclosure, and the thickness Lg2 may correspond to a specific but non-limiting example of the "first distance" of any embodiment of the disclosure. In the sub-pixel 12B, the upper layer may have an ideal thickness Lb1 of 170 nm, and the lower layer may have an ideal thickness Lb2 of 180 nm. The thicknesses Lb1 and Lb2 each correspond to an optical path length that causes resonance of light emitted from the light-emitting center 24a with the microcavity structure Cb.

Described in the lower rows of the table in FIG. 8 are exemplary thicknesses of the respective layers in the organic electroluminescent element 12-2. Each of the electron transport layer 25 and the electron injection layer 26 may be collectively formed in the respective sub-pixels 12 by vapor deposition or sputtering. The total thickness of the electron transport layer 25 and the electron injection layer 26 may be 170 nm. In the organic electroluminescent element 12r, the organic light-emitting layer 24 may have a thickness of 80 nm, and the total thickness of the hole transport layer 23 and the hole injection layer 22 may be 60 nm. In the organic electroluminescent element 12g, the organic light-emitting layer 24 may have a thickness of 45 nm, and the total thickness of the hole transport layer 23 and the hole injection layer 22 may be 50 nm. In the organic electroluminescent element 12b, the organic light-emitting layer 24 may have a thickness of 50 nm, and the total thickness of the hole transport layer 23 and the hole injection layer 22 may be 130 nm.

It is apparent from FIG. 8 that the thickness of the organic light-emitting layer 24 in each sub-pixel 12 is in a range from 45 nm to 80 nm, which is suitable for coating, and the total thickness of the hole transport layer 23 and the hole injection layer 22 is in a range from 50 nm to 130 nm, which is suitable for coating.

FIG. 9 is a table of example thicknesses of layers in the respective sub-pixels 12R, 12G, and 12B of a comparative example. In detail, FIG. 9 is a table of example thicknesses of the respective layers in an embodiment where the light-emitting center 24a resides at a position within the organic light-emitting layer and adjacent to the hole transport layer, in each sub-pixel of the comparative example. The unit of each thickness in FIG. 9 is a nanometer (nm). Described in the upper rows of the table in FIG. 9 are ideal thicknesses of a layer above the light-emitting center 24a (hereinafter also referred to as upper layer) and a layer below the light-emitting center 24a (hereinafter also referred to as lower layer) in the microcavity structures of the respective sub-pixels. Described in the lower rows of the table in FIG. 9 are example thicknesses of the respective layers in the comparative organic electroluminescent element. It is apparent from FIG. 9 that the total thickness of the hole transport layer 23 and the hole injection layer 22 in the sub-pixel 12B is greater than the thickness suitable for coating. This demonstrates that positioning the light-emitting center 24a at the position within the organic light-emitting layer and adjacent to the hole transport layer is inappropriate for coating.

A typical simulation determines the cavity order of the microcavity structure on the basis of only interference effects. Consequently, light extraction efficiency significantly decreases with an increase in cavity order, as illustrated in FIG. 10. This demonstrates that the first-order cavity is appropriate, and the second-order and third-order cavities are inappropriate, for an enhancement of the light extraction efficiency. In contrast, the inventor of the present application found that the cavity order of the microcavity structure should be determined on the basis of the interference effects and also metal extinction. The inventor of the present application thereafter derived a correlation between the light extraction efficiency and the cavity order of the microcavity structure through the simulation based on the interference effects and the metal extinction. The results of the simulation are illustrated in FIG. 11. It is apparent from FIG. 11 that the second-order cavity is appropriate rather than the first-order cavity in the sub-pixels 12R and 12G. It is also apparent from FIG. 11 that the third-order cavity is appropriate rather than the first-order cavity in the sub-pixel 12B. One reason why the light extraction efficiency in the second-order cavity is lower than that in the third-order cavity in the sub-pixel 12B is presumably due to the metal extinction which exerts an influence on the sub-pixel 12B over a wider distance than on the sub-pixels 12R and 12G.

(A), (B), and (C) of FIG. 12 each illustrate an exemplary intensity map of the light extraction efficiency with a horizontal axis representing the thickness of the lower layer and a vertical axis representing the thickness of the upper layer. FIG. 13 is a table of exemplary peak values in percentage in the respective cavity orders, relative to maximum values of the light extraction efficiency 100% in (A), (B), and (C) of FIG. 12.

With reference to (A), (B), and (C) of FIG. 12, two second-order cavities and three third-order cavities are generated. It is apparent from (A), (B), and (C) of FIG. 12 that the light extraction efficiency in the second-order cavity is higher in a case where the lower layer has a smaller thickness and the upper layer has a larger thickness than in a case where the lower layer has a larger thickness and the upper layer has a smaller thickness. It is also apparent from (A), (B), and (C) of FIG. 12 that the light extraction efficiency in the third-order cavity is highest in a case where the lower layer has the second smallest thickness and the upper layer has the second smallest thickness. Additionally, it is apparent, from a comparison between the light extraction efficiency in the second-order cavity and the light extraction efficiency in the third-order cavity, that the light extraction efficiency is higher in the second-order cavity than in the third-order cavity, in the sub-pixels 12R and 12G. In contrast, it is also apparent that the light extraction efficiency is higher in the third cavity than in the second cavity, in the sub-pixel 12B.

For the exemplary reasons described hereinabove, the microcavity structures Cr and Cg each have an optical path length that causes the second cavity, and the microcavity structure Cb has an optical path length that causes the third cavity, for an enhancement of light extraction efficiency.

Figure 16:
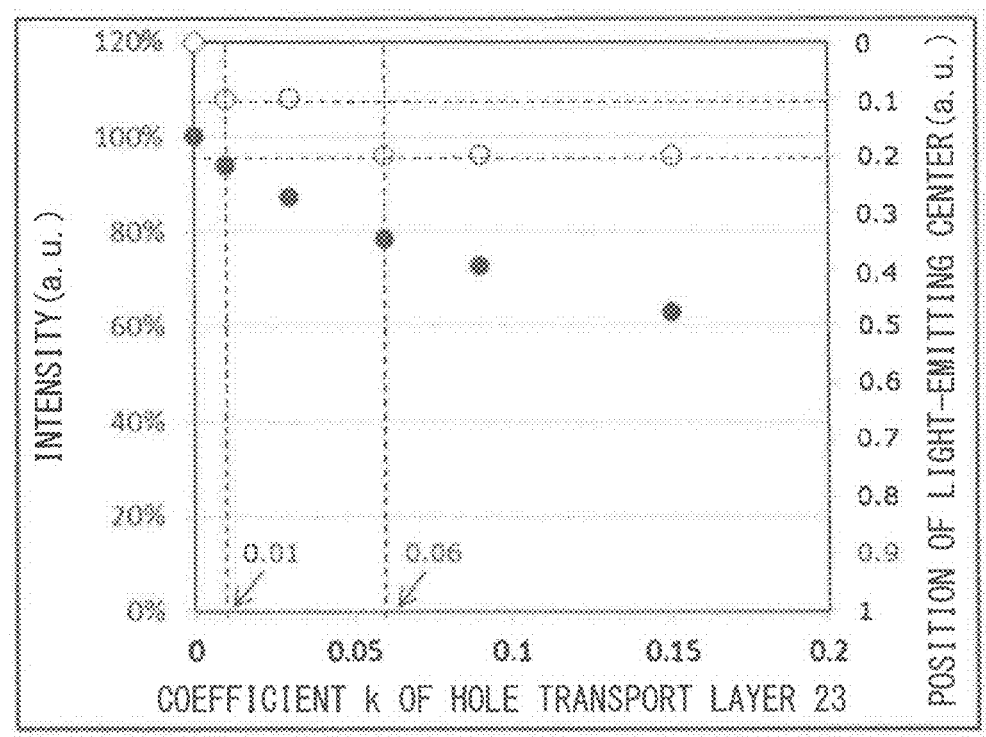
FIG. 16 is a graph illustrating an exemplary correlation between an absorption coefficient of a hole transport layer and the light extraction intensity.

FIG. 14 is a graph illustrating an exemplary correlation between the position of the light-emitting center 24a and the light extraction intensity in the organic electroluminescent element 12-2 according to any embodiment of the disclosure. FIG. 15 is a graph illustrating an exemplary correlation between the position of the light-emitting center 24a and the light extraction intensity in the organic electroluminescent element according to the comparative example. FIG. 16 is a graph illustrating an exemplary correlation between an absorption coefficient k of the hole transport layer 23 and the light extraction intensity. The absorption coefficient k may be measured by, for example, a spectroscopic ellipsometer that is applicable to measurement of thin films having a thickness in a range from several ten nanometers to several hundred nanometers.

FIG. 14 illustrates an exemplary correlation between the position of the light-emitting center 24a and the light extraction intensity in the sub-pixels 12R and 12G in an embodiment where the hole transport layer 23 in contact with the organic light-emitting layer 24 has an absorption coefficient k of 0.06. FIG. 15 illustrates an exemplary correlation between the position of the light-emitting center 24a and the light extraction intensity in the sub-pixels 12R and 12G in an embodiment where the hole transport layer 23 in contact with the organic light-emitting layer 24 has an absorption coefficient k of 0. In FIGS. 14 and 15, the resonance point positions at the interface between the organic light-emitting layer 24 and the hole transport layer 23 in the microcavity structure Cr and Cg. FIG. 16 illustrates an exemplary correlation between the absorption coefficient k of the hole transport layer 23 and the light extraction intensity at the interface between the organic light-emitting layer 24 and the hole transport layer 23, in the sub-pixels 12R and 12G.

In a practical sense, the absorption coefficient k of the hole transport layer 23 is not zero and may depend on the material of the hole transport layer 23. In general, the hole transport layers 23 of one or more of the sub-pixels 12R and 12G may have an absorption coefficient k of 0.01 or greater and 0.06 or less. The hole transport layer 23 having such an absorption coefficient k may cause a loss of near-field light energy in a case where the light-emitting center 24a positions at the interface between the organic light-emitting layer 24 and the hole transport layer 23. This may possibly reduce the light extraction efficiency.

To address this concern, the organic electroluminescent element 12-2 according to any embodiment of the disclosure may have the following exemplary configuration. In one embodiment where the sub-pixel 12 includes the hole transport layer 23 including the material having the absorption coefficient k of 0.01 or greater and 0.06 or less, the organic light-emitting layer 24 has the light-emitting center 24a receding from the interface between the organic light-emitting layer 24 and the hole transport layer 23 by a thickness greater than 0 and equal to or less than 0.4, where the organic light-emitting layer 24 has a thickness of 1, as illustrated in FIG. 14, for example. The light-emitting center 24a in this configuration may correspond to a specific but non-limiting example of a "first light-emitting center" according to any embodiment of the disclosure. Such a configuration enhances the light extraction efficiency, compared with a configuration in which the light-emitting center 24a positions at the interface between the organic light-emitting layer 24 and the hole transport layer 23. In another embodiment where the sub-pixel 12 includes the hole transport layer 23 including the material having the absorption coefficient k of 0.01 or greater and 0.06 or less, the organic light-emitting layer 24 may have the light-emitting center 24a (i.e., the first light-emitting center) receding from the interface between the organic light-emitting layer 24 and the hole transport layer 23 by a thickness of 0.1 or greater and 0.2 or less, where the organic light-emitting layer 24 has a thickness of 1, as illustrated in FIG. 14, for example. This configuration most efficiently enhances the light extraction efficiency.

Solid circles in FIG. 16 illustrate the light extraction intensity at the interface between the organic light-emitting layer 24 and the hole transport layer 23. The light extraction intensity at the interface gradually decreases with an increase in the absorption coefficient k of the hole transport layer 23 from zero. One reason for the gradual decrease in the light extraction intensity may be a loss of the near-field light energy due to the absorption coefficient k of the hole transport layer 23. Open circles in FIG. 16 illustrate maximum light extraction intensity at the position receding from the interface between the organic light-emitting layer 24 and the hole transport layer 23 by a thickness of 0.1 or greater and 0.2 or less, where the organic light-emitting layer 24 has a thickness of 1. Such light-emitting center 24a slightly receding from the resonance point or the interface between the organic light-emitting layer 24 and the hole transport layer 23 maximizes the light extraction intensity.

[Effect]

Some effects of the organic electroluminescent panel 10 and the organic electroluminescent unit 1 including the organic electroluminescent panel 10 will now be described.

Many attempts have been made to enhance the light extraction efficiency of the organic electroluminescent element with an aim to reduce electric-power consumption by the enhancement of the light extraction efficiency. One possible measure to enhance the light extraction efficiency may be utilization of microcavity effects. The microcavity structure determined through a typical optical calculation based on only the interference effects, however, may rather exhibit reduced the light extraction efficiency in the second- or higher-order cavity, as illustrated in FIG. 9.

In contrast, in any embodiment of the disclosure, the microcavity structures of the sub-pixels 12R and 12G each have an optical path length that causes the second cavity. Additionally, the microcavity structure of the sub-pixel 12B has an optical path length that causes the third cavity. These microcavity structures may be determined by the optical calculation based on the interference effects and also the effects of the metal extinction. One reason for the use of the calculation is that the light extraction efficiency depends on the interference effects and also the effects of the metal extinction, as illustrated in FIG. 10. With reference to FIG. 10, the utilization of the second cavity in the sub-pixels 12R and 12G maximizes the light extraction efficiency, and the utilization of the third cavity in the sub-pixel 12B maximizes the light extraction efficiency. Accordingly, in any embodiment of the disclosure, the microcavity structures of the sub-pixels 12R and 12G each have the optical path length (cavity length) that causes the second cavity, and the microcavity structure of the sub-pixel 12B has the optical path length (cavity length) that causes the third cavity. This mitigates the interference effects and also the influence of the metal extinction, enhancing light extraction efficiency. Accordingly, it is possible to provide the organic electroluminescent element 12-2 with improved performance.

In any embodiment of the disclosure, the distances Lr and Lg between the anode 21 and the cathode 27 are each the optical path length that causes the second cavity in the sub-pixels 12R and 12G. In other words, the hole injection layers 22, the hole transport layers 23, the organic light-emitting layers 24, the electron transport layer 25, and the electron injection layers 26 in the sub-pixels 12R and 12G each have a thickness that is adjusted to cause the distances Lr and Lg between the anode 21 and the cathode 27 to be the optical path lengths that cause the second cavity. Additionally, the distance Lb between the anode 21 and the cathode 27 is the optical path length that causes the third cavity in the sub-pixel 12B. In other words, the hole injection layer 22, the hole transport layer 23, the organic light-emitting layer 24, the electron transport layer 25, and the electron injection layer 26 in the sub-pixel 12B each have a thickness that is adjusted to cause the distance Lb between the anode 21 and the cathode 27 to be the optical path length that causes the third cavity. This enhances the light extraction efficiency and improves the performance of the organic electroluminescent element 12-2. Further, the electron transport layer 25 may have substantially the same thickness in the sub-pixels 12R, 12G, and 12B. This allows the electron transport layer 25 to be common among the sub-pixels 12R, 12G, and 12B.

In any embodiment of the disclosure, the electron transport layer 25 may be common among the sub-pixels 12R, 12G, and 12B. This allows the electron transport layer 25 to be collectively formed without using a mask. Accordingly, the electron transport layer 25 may be a vapor-deposited or sputtered film that is common among the sub-pixels 12R, 12G, and 12B.

In any embodiment of the disclosure, the light-emitting centers 24a in the sub-pixels 12R and 12G may each reside at the position within the organic light-emitting layer 24 and adjacent to the hole transport layer 23, and the light-emitting center 24a in the sub-pixel 12B may reside at the position within the organic light-emitting layer 24 and adjacent to the electron transport layer 25. This allows the thickness of the organic light-emitting layer 24 in each sub-pixel 12 to be in a range from 45 nm to 80 nm, as illustrated, for example, in FIG. 8, which range is suitable for coating. This also allows the total thickness of the hole transport layer 23 and the hole injection layer 22 to be in a range from 50 nm to 130 nm, as illustrated, for example, in FIG. 8, which range is suitable for coating. Accordingly, it is possible to form the organic electroluminescent elements 12-2 in the sub-pixels 12 by coating, which enables to manufacture the organic electroluminescent panel 10 in large size with a reduced cost.

There also has been a demand for maximizing the light extraction efficiency of the coated elements with which a large-sized panel is to be readily manufactured with a low cost. The coated elements may refer to, for example, the organic electroluminescent elements 12-2 each including the hole transport layer 23 and the organic light-emitting layer 24 that are formed by coating, and the electron transport layer 25 that is collectively formed in the RGB pixels. Manufacture of the coated elements eliminates the need for mask patterning, enabling manufacture of a large-sized and inexpensive panel.

For the coated elements, however, the electron transport layer 25 may be collectively formed. Accordingly, the electron transport layer 25 may inevitably have a thickness optimized for the sub-pixel 12B, a major bottleneck for electric power, that exhibits the lowest light emission efficiency. Such a design, however, may possibly reduce the light extraction efficiency in the sub-pixels 12R and the sub-pixel 12G.

In contrast, in any embodiment of the disclosure, the light-emitting center 24a recedes from the interface which is most susceptible to an influence of the light extinction caused by the hole transport layer 23 including the material having the absorption coefficient k of 0.01 or greater and 0.06 or less by a thickness greater than 0 and equal to or less than 0.4, where the organic light-emitting layer 24 has a thickness of 1. This efficiently suppresses a reduction in the light extraction intensity caused by a displacement of the light-emitting center 24a from the resonance point, while avoiding the influence of the light extinction caused by the hole transport layer 23. Accordingly, it is possible to enhance the performance or light extraction efficiency of the organic electroluminescent elements.

Further, in any embodiment of the disclosure, the light-emitting center 24a may recede from the interface which is most susceptible to an influence of the light extinction caused by the hole transport layer 23 including the material having the absorption coefficient k of 0.01 or greater and 0.06 or less by a thickness of 0.1 or greater and 0.2 or less, where the organic light-emitting layer 24 has a thickness of 1. This more efficiently suppresses a reduction in the light extraction intensity caused by a displacement of the light-emitting center 24a from the resonance point, while avoiding the influence of the light extinction caused by the hole transport layer 23. Accordingly, it is possible to enhance the performance or light extraction efficiency of the organic electroluminescent elements.

2. APPLICATION EXAMPLE

Application Example 1

Described below is an application example of the organic electroluminescent unit 1 according to one embodiment of the disclosure. The organic electroluminescent unit 1 is applicable to a variety of display units of electronic apparatuses that display external or internal image signals as images or pictures. Non-limiting examples of the electronic apparatuses may include televisions, digital cameras, notebook personal computers, sheet-like personal computers, portable terminal devices such as mobile phones, and video cameras.

Figure 17:
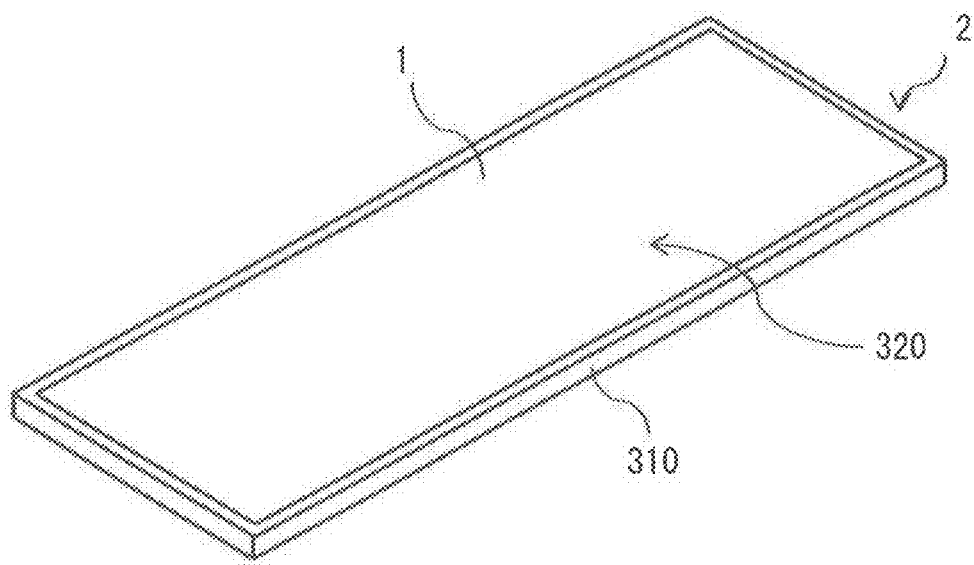
FIG. 17 schematically illustrates an exemplary external appearance of an electronic apparatus provided with an organic electroluminescent unit according to one embodiment of the disclosure.

FIG. 17 is a perspective view of an external appearance of an electronic apparatus 2 of the present application example. The electronic apparatus 2 may be, for example, a sheet-like personal computer including a body 310 having a display surface 320 on a main face. The organic electroluminescent unit 1 may be provided on the display surface 320 of the electronic apparatus 2. The organic electroluminescent unit 1 may be disposed such that the display panel 10 faces outward. The electronic apparatus 2 of the present application example including the organic electroluminescent unit 1 on the display surface 320 exhibits high light emission efficiency.

Application Example 2

Described below is an application example of the organic electroluminescent element 12-2 according to one embodiment of the disclosure. The organic electroluminescent element 12-2 is applicable to a variety of light sources in illumination apparatuses for table lightings, floor lightings, and room lightings.

Figure 18:
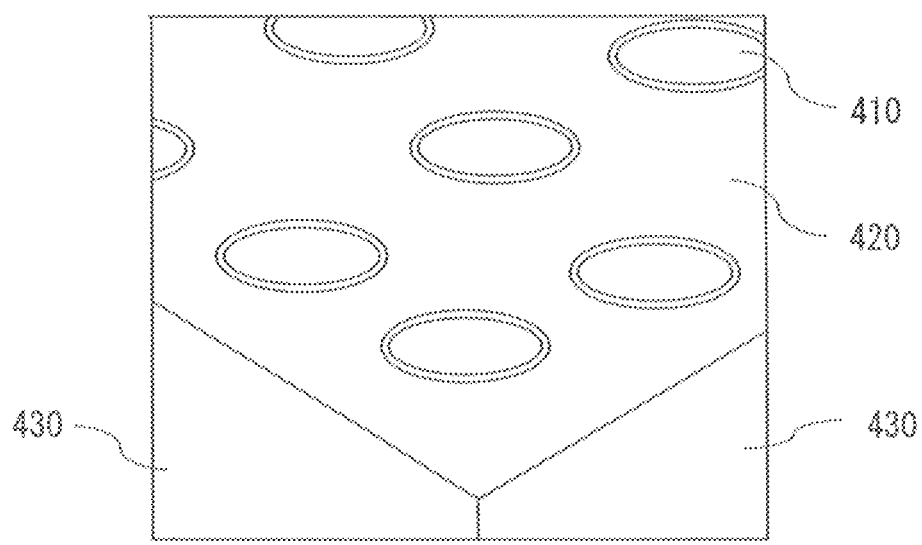
FIG. 18 schematically illustrates an exemplary external appearance of an illumination apparatus including an organic electroluminescent element according to one embodiment of the disclosure.

FIG. 18 illustrates an external appearance of an illumination apparatus for a room lighting to which the organic electroluminescent elements 12-2 are applied. The illumination apparatus may include, for example, illuminating sections 410 each including one or more of the organic electroluminescent elements 12-2. An appropriate number of the illuminating sections 410 are disposed at appropriate intervals on a ceiling 420. Note that the illuminating sections 410 may be installed on any place, such as a wall 430 or a non-illustrated floor, other than the ceiling 420, depending on the intended use.

The illumination apparatus may perform illumination with light emitted from the organic electroluminescent elements 12-2. Accordingly, the illumination apparatus exhibits high light emission efficiency.

Although the disclosure is described with reference to the embodiments hereinabove, these embodiments are not to be construed as limiting the scope of the disclosure and may be modified in a wide variety of ways. For example, although the line banks 13 and the banks 15 may be provided in multiple numbers on the substrate 14 in the foregoing embodiments, a single pixel bank may be disposed for each sub-pixel 12.

In the foregoing exemplary embodiments, the microcavity structures of the sub-pixels 12R and 12G each have the optical path length that causes the second cavity. Additionally, the microcavity structure of the sub-pixel 12B has the optical path length that causes the third cavity. In an alternative embodiment, the microcavity structures of the sub-pixels 12R, 12G, and 12B may be in a different combination from that in the foregoing embodiments. For example, the microcavity structures of the sub-pixels 12R, 12G, and 12B may each have an optical path length that causes the first or second cavity.

It should be appreciated that the effects described herein are mere examples. Effects of an embodiment of the disclosure are not limited to those described herein. The disclosure may further include any effects other than those described herein.

Moreover, the disclosure may have the following configurations, for example.

(1) An organic electroluminescent element including, in order:
   an anode;
   an organic layer including a light-emitting layer; and
   a cathode,
   the organic layer further including a first organic layer that is provided between the light-emitting layer and the anode, and including a hole transport layer, the hole transport layer including a material having an absorption coefficient of 0.01 or greater and 0.06 or less,
   the light-emitting layer having a light-emitting center receding from a first interface of the light-emitting layer by a thickness greater than 0 and equal to or less than 0.4, where the light-emitting layer has a thickness of 1, the first interface being adjacent to the anode,
   the organic electroluminescent element further including a microcavity structure in which a position of the first interface is a resonance point.

(2) The organic electroluminescent element according to (1), in which the light-emitting layer has the light-emitting center receding from the first interface of the light-emitting layer by the thickness of 0.1 or greater and 0.2 or less, where the light-emitting layer has the thickness of 1.

(3) The organic electroluminescent element according to (1) or (2), in which a first distance between the first interface and the anode and a second distance between the first interface and the cathode are each an optical path length that causes resonance of light emitted from the light-emitting center with the microcavity structure.

(4) The organic electroluminescent element according to any one of (1) to (3), in which
   the organic layer further includes a second organic layer that is provided between the light-emitting layer and the cathode,
   the second organic layer is a vapor-deposited film or a sputtered film, and
   the light-emitting layer and the first organic layer are coated films.

(5) The organic electroluminescent element according to any one of (1) to (4), in which the hole transport layer is an insolubilized hole transport layer.

(6) An organic electroluminescent panel including:
   a red pixel;
   a green pixel; and
   a blue pixel,
   the red pixel, the green pixel, and the blue pixel including respective organic electroluminescent elements, the organic electroluminescent elements each including, in order, an anode, an organic layer including a light-emitting layer, and a cathode,
   the organic layer of the red pixel or the green pixel or both further including a first organic layer that is provided between the light-emitting layer and the anode, the first organic layer including a hole transport layer, the hole transport layer including a material having an absorption coefficient of 0.01 or greater and 0.06 or less,
   the light-emitting layer in any of the red pixel and the green pixel that includes the hole transport layer having a first light-emitting center receding from a second interface of the light-emitting layer by a thickness greater than 0 and equal to or less than 0.4, where the light-emitting layer has a thickness of 1,the second interface being adjacent to the hole transport layer,
   the organic electroluminescent element in any of the red pixel and the green pixel that includes the hole transport layer further including a microcavity structure in which a position of the second interface is a resonance point.

(7) The organic electroluminescent panel according to (6), in which
   the organic layer further includes a second organic layer that is provided between the light-emitting layer and the cathode,
   the second organic layer includes an electron transport layer,
   the electron transport layer is a vapor-deposited film or a sputtered film, and
   the light-emitting layer and the first organic layer are coated films.

(8) The organic electroluminescent panel according to (7), in which the electron transport layer is common among the red pixel, the green pixel, and the blue pixel.

(9) The organic electroluminescent panel according to (7) or (8), in which the light-emitting layer in the blue pixel has a second light-emitting center at a position within the light-emitting layer and adjacent to the electron transport layer.

(10) An organic electroluminescent unit including:
   an organic electroluminescent panel; and
   a driving circuit configured to drive the organic electroluminescent panel,
   the organic electroluminescent panel including a red pixel, a green pixel, and a blue pixel,
   the red pixel, the green pixel, and the blue pixel including respective organic electroluminescent elements, the organic electroluminescent elements each including, in order, an anode, an organic layer including a light-emitting layer, and a cathode,
   the organic layer of one or more of the red pixel, the green pixel, and the blue pixel further including a first organic layer that is provided between the light-emitting layer and the anode, the first organic layer including a hole transport layer, the hole transport layer including a material having an absorption coefficient of 0.01 or greater and 0.06 or less,
   the light-emitting layer in any of the red pixel, the green pixel, and the blue pixel that includes the hole transport layer having a light-emitting center receding from a second interface of the light-emitting layer by a thickness greater than 0 and equal to or less than 0.4, where the light-emitting layer has a thickness of 1, the second interface being adjacent to the hole transport layer,
   the organic electroluminescent element in any of the red pixel, the green pixel, and the blue pixel that includes the hole transport layer further including a microcavity structure in which a position of the second interface is a resonance point.

(11) An electronic apparatus provided with an organic electroluminescent unit, the organic electroluminescent unit including:
   an organic electroluminescent panel; and a driving circuit configured to drive the organic electroluminescent panel, the organic electroluminescent panel including a red pixel, a green pixel, and a blue pixel, the red pixel, the green pixel, and the blue pixel including respective organic electroluminescent elements, the organic electroluminescent elements each including, in order, an anode, an organic layer including a light-emitting layer, and a cathode, the organic layer of one or more of the red pixel, the green pixel, and the blue pixel further including a first organic layer that is provided between the light-emitting layer and the anode, the first organic layer including a hole transport layer, the hole transport layer including a material having an absorption coefficient of 0.01 or greater and 0.06 or less, the light-emitting layer in any of the red pixel, the green pixel, and the blue pixel that includes the hole transport layer having a light-emitting center receding from a second interface of the light-emitting layer by a thickness greater than 0 and equal to or less than 0.4, where the light-emitting layer has a thickness of 1, the second interface being adjacent to the hole transport layer, the organic electroluminescent element in any of the red pixel, the green pixel, and the blue pixel that includes the hole transport layer further including a microcavity structure in which a position of the second interface is a resonance point.

(12) An organic electroluminescent panel including:
 a red pixel;
 a green pixel; and
 a blue pixel,
 the red pixel, the green pixel, and the blue pixel including respective organic electroluminescent elements, the organic electroluminescent elements each including a microcavity structure,
 the microcavity structure of the red pixel having an optical path length that causes a second cavity,
 the microcavity structure of the green pixel having an optical path length that causes the second cavity,
 the microcavity structure of the blue pixel having an optical path length that causes a third cavity.

(13) The organic electroluminescent panel according to (12), in which the organic electroluminescent elements in the red pixel, the green pixel, and the blue pixel each include, in order, an anode, a hole transport layer, a light-emitting layer, an electron transport layer, and a cathode, and
 a distance between the anode and the cathode in each of the red pixel, the green pixel, and the blue pixel has an optical path length that causes the second cavity or the third cavity.

(14) The organic electroluminescent panel according to (12), in which the electron transport layer is common among the red pixel, the green pixel, and the blue pixel, and
 the hole transport layer and the light-emitting layer each have a thickness that is adjusted to cause the distance between the anode and the cathode to be the optical path length that causes the second cavity or the third cavity.

(15) The organic electroluminescent panel according to (14), in which
 the electron transport layer is a vapor-deposited film or a sputtered film, and
 the hole transport layer and the light-emitting layer are coated films.

(16) The organic electroluminescent panel according to (14) or (15), in which the light-emitting layer has a light-emitting center at a position within the light-emitting layer and adjacent to the hole transport layer, in the red pixel and the green pixel, and
 the light-emitting layer has a light-emitting center at a position within the light-emitting layer and adjacent to the electron transport layer, in the blue pixel.

(17) An organic electroluminescent unit including:
 an organic electroluminescent panel; and
 a driving circuit configured to drive the organic electroluminescent panel,
 the organic electroluminescent panel including a red pixel, a green pixel, and a blue pixel,
 the red pixel, the green pixel, and the blue pixel including respective organic electroluminescent elements, the organic electroluminescent elements each including a microcavity structure,
 the microcavity structure of the red pixel having an optical path length that causes a second cavity,
 the microcavity structure of the green pixel having an optical path length that causes the second cavity,
 the microcavity structure of the blue pixel having an optical path length that causes a third cavity.

(18) An electronic apparatus provided with an organic electroluminescent unit, the organic electroluminescent unit including:
 an organic electroluminescent panel; and
 a driving circuit configured to drive the organic electroluminescent panel,
 the organic electroluminescent panel including a red pixel, a green pixel, and a blue pixel,
 the red pixel, the green pixel, and the blue pixel including respective organic electro luminescent elements, the organic electroluminescent elements each having a microcavity structure,
 the microcavity structure of the red pixel having an optical path length that causes a second cavity,
 the microcavity structure of the green pixel having an optical path length that causes the second cavity,
 the microcavity structure of the blue pixel having an optical path length that causes a third cavity.

In the organic electroluminescent element, the organic electroluminescent panel, the organic electroluminescent unit, and the electronic apparatus according to one embodiment of the disclosure, the light-emitting center recedes from the interface which is most susceptible to an influence of the light extinction caused by the hole transport layer by a thickness greater than 0 and equal to or less than 0.4, where the organic light-emitting layer has a thickness of 1. This suppresses a reduction in the light extraction intensity caused by a displacement of the light-emitting center from the resonance point, while avoiding the influence of the light extinction caused by the hole transport layer.

In the organic electroluminescent panel, the organic electroluminescent unit, and the electronic apparatus according to one embodiment of the disclosure, the microcavity structures of the red pixel and the green pixel each have an optical path length that causes the second cavity. Additionally, the microcavity structure of the blue pixel has an optical path length that causes the third cavity. This mitigates the interference effects and also the influence of the metal extinction.

In the organic electroluminescent element according to any embodiment of the disclosure, the organic electroluminescent panel, the organic electroluminescent unit, and the electronic apparatus according to one embodiment of the disclosure, it is possible to suppress a reduction in light extraction intensity caused by a displacement of the light-emitting center from the resonance point, while avoiding the influence of the light extinction caused by the hole transport layer. This enhances the performance of the organic electroluminescent element.

In the organic electroluminescent panel according to any embodiment of the disclosure, the organic electroluminescent unit, and the electronic apparatus according to one embodiment of the disclosure, it is possible to mitigate the interference effects and also the influence of the metal extinction. This enhances the performance of the organic electroluminescent element.

Effects of the disclosure are not limited to those described hereinabove, and may be any effect described herein.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the use of the terms first, second, etc. do not denote any order or importance, but rather the terms first, second, etc. are used to distinguish one element from another. Moreover, no element or component in this disclosure is intended to be dedicated to the public regardless of whether the element or component is explicitly recited in the following claims.

What is claimed is:

1. An organic electroluminescent panel comprising:
    a red pixel;
    a green pixel; and
    a blue pixel,
    the red pixel, the green pixel, and the blue pixel including respective organic electroluminescent elements, the organic electroluminescent elements each including a microcavity structure,
    the microcavity structure of the red pixel having an optical path length that causes a first cavity, wherein the first cavity has a cavity order of 2,
    the microcavity structure of the green pixel having an optical path length that causes a second cavity, and the second cavity has a cavity order of 2,
    the microcavity structure of the blue pixel having an optical path length that causes a third cavity, and the third cavity has a cavity order of,
    wherein
        the organic electroluminescent elements in the red pixel, the green pixel, and the blue pixel each include, in order, an anode, a hole transport layer, a light-emitting layer, an electron transport layer, and a cathode,
        a distance between the anode and the cathode in each of the red pixel, the green pixel, and the blue pixel has an optical path length that causes the cavity order of 2 or the cavity order of 3,
        the electron transport layer is common among the red pixel, the green pixel, and the blue pixel, and
        the hole transport layer and the light-emitting layer each have a thickness that is adjusted to cause the distance between the anode and the cathode to be the optical path length that causes the cavity order of 2 or the cavity order of 3.

2. The organic electroluminescent panel according to claim 1, wherein the electron transport layer comprises a vapor-deposited film or a sputtered film, and
    the hole transport layer and the light-emitting layer comprise coated films.

3. The organic electroluminescent panel according to claim 1, wherein
    the light-emitting layer has a light-emitting center at a position within the light-emitting layer and adjacent to the hole transport layer, in the red pixel and the green pixel, and
    the light-emitting layer has a light-emitting center at a position within the light-emitting layer and adjacent to the electron transport layer, in the blue pixel.

4. The organic electroluminescent panel according to claim 1, wherein
    a distance between the anode and the cathode in the red pixel causes the cavity order of 2.

5. The organic electroluminescent panel according to claim 4, wherein
    the electron transport layer is common among the red pixel, the green pixel, and the blue pixel, and
    the hole transport layer has a first thickness, the light-emitting layer has a second thickness, and the first and second thickness determine the distance between the anode and the cathode in the red pixel to be the optical path length that causes the cavity order of 2.

6. The organic electroluminescent panel according to claim 1, wherein
    a distance between the anode and the cathode in the green pixel causes the cavity order of 2.

7. The organic electroluminescent panel according to claim 6, wherein
    the electron transport layer is common among the red pixel, the green pixel, and the blue pixel, and
    the hole transport layer has a first thickness, the light-emitting layer has a second thickness, and the first and second thickness determine the distance between the anode and the cathode in the green pixel to be the optical path length that causes the cavity order of 2.

8. The organic electroluminescent panel according to claim 1, wherein
    a distance between the anode and the cathode in the blue pixel causes the cavity order of 3.

9. The organic electroluminescent panel according to claim 8, wherein
    the electron transport layer is common among the red pixel, the green pixel, and the blue pixel, and
    the hole transport layer has a first thickness, the light-emitting layer has a second thickness, and the first and second thickness determine the distance between the anode and the cathode in the blue pixel to be the optical path length that causes the cavity order of 3.

10. An organic electroluminescent panel comprising:
    a red pixel configured to emit a first wavelength of light, wherein the red pixel comprises a first organic electroluminescent element having a first microcavity structure, and a first optical path length of the first microcavity structure defines a cavity order of 2 for the first microcavity structure based on the first wavelength of light;
    a green pixel configured to emit a second wavelength of light different from the first wavelength of light, wherein the green pixel comprises a second organic electroluminescent element having a second microcavity structure, and a second optical path length of the second microcavity structure defines a cavity order of 2 for the second microcavity structure based on the second wavelength of light;

a blue pixel configured to emit a third wavelength of light different from the first wavelength of light and the second wavelength of light, wherein the blue pixel comprises a third organic electroluminescent element having a third microcavity structure, and a third optical path length of the third microcavity structure defines a cavity order of 3 for the third microcavity structure based on the third wavelength of light; and an electron transport layer common to each of the red pixel, the green pixel and the blue pixel, wherein the first optical path length is different from the second optical path length and the third optical path length.

11. The organic electroluminescent panel according to claim 10, wherein the red pixel comprises:
an anode,
a hole transport layer,
a light-emitting layer,
the electron transport layer, and
a cathode, wherein a distance from the anode to the cathode determines the first optical path length.

12. The organic electroluminescent panel according to claim 11, wherein the hole transparent layer comprises a material having an absorption coefficient ranging from 0.01 to 0.06.

13. The organic electroluminescent panel according to claim 11, wherein a center thickness of the light-emitting layer ranges from greater than 0% to 40% of a periphery thickness of the light-emitting layer.

14. The organic electroluminescent panel according to claim 11, wherein a center thickness of the light-emitting layer ranges from greater than 10% to 20% of a periphery thickness of the light-emitting layer.

15. The organic electroluminescent panel according to claim 10, wherein the green pixel comprises:
an anode,
a hole transport layer,
a light-emitting layer,
the electron transport layer, and
a cathode, wherein a distance from the anode to the cathode determines the second optical path length.

16. The organic electroluminescent panel according to claim 15, wherein the hole transparent layer comprises a material having an absorption coefficient ranging from 0.01 to 0.06, and a center thickness of the light-emitting layer ranges from greater than 10% to 20% of a periphery thickness of the light-emitting layer.

17. The organic electroluminescent panel according to claim 10, wherein the blue pixel comprises:
an anode,
a hole transport layer,
a light-emitting layer,
the electron transport layer, and
a cathode, wherein a distance from the anode to the cathode determines the third optical path length.

* * * * *